(12) United States Patent
Yoshikawa

(10) Patent No.: US 8,742,501 B2
(45) Date of Patent: Jun. 3, 2014

(54) POWER SEMICONDUCTOR DEVICES AND METHODS FOR MANUFACTURING THE SAME

(75) Inventor: Koh Yoshikawa, Nagano (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/557,480

(22) Filed: Jul. 25, 2012

(65) Prior Publication Data

US 2012/0286326 A1 Nov. 15, 2012

Related U.S. Application Data

(62) Division of application No. 12/539,295, filed on Aug. 11, 2009, now Pat. No. 8,258,032.

(30) Foreign Application Priority Data

Aug. 14, 2008 (JP) ............................ PA 2008-209000

(51) Int. Cl.
*H01L 29/66* (2006.01)

(52) U.S. Cl.
USPC ........... 257/341; 257/342; 257/492; 257/493; 257/E29.257; 257/E29.26

(58) Field of Classification Search
USPC .................. 257/341, 342, 492, 493, E29.257, 257/E29.26
See application file for complete search history.

(56) References Cited

U.S. PATENT DOCUMENTS

| | | | |
|---|---|---|---|
| 5,164,804 A | 11/1992 | Terashima | |
| 5,900,662 A | 5/1999 | Frisina et al. | |
| 6,127,226 A | 10/2000 | Lin et al. | |
| 7,737,490 B2 | 6/2010 | Yoshikawa et al. | |
| 7,737,522 B2 | 6/2010 | Lui et al. | |
| 8,089,094 B2 * | 1/2012 | Yoshikawa | 257/139 |
| 2002/0130331 A1 | 9/2002 | Nemoto et al. | |
| 2004/0041225 A1 | 3/2004 | Nemoto | |

FOREIGN PATENT DOCUMENTS

| | | |
|---|---|---|
| JP | 01-209766 A | 8/1989 |
| JP | 04-003981 A | 1/1992 |
| JP | 04-127480 A | 4/1992 |
| JP | 2663679 | 6/1997 |
| JP | 09-232567 A | 9/1997 |
| JP | 2000-200906 A | 7/2000 |

(Continued)

OTHER PUBLICATIONS

Foreign Office Action partial English translation.

*Primary Examiner* — Minh-Loan T Tran
(74) *Attorney, Agent, or Firm* — Rabin & Berdo, P.C.

(57) ABSTRACT

A power semiconductor device that realizes high-speed turn-off and soft switching at the same time has an n-type main semiconductor layer that includes lightly doped n-type semiconductor layers and extremely lightly doped n-type semiconductor layers arranged alternately and repeatedly between a p-type channel layer and an n⁺-type field stop layer, in a direction parallel to the first major surface of the n-type main semiconductor layer. A substrate used for manufacturing the semiconductor device is fabricated by forming trenches in an n-type main semiconductor layer 1 and performing ion implantation and subsequent heat treatment to form an n⁺-type field stop layer in the bottom of the trenches. The trenches are then filled with a semiconductor doped more lightly than the n-type main semiconductor layer for forming extremely lightly doped n-type semiconductor layers. The manufacturing method is applicable with variations to various power semiconductor devices such as IGBT's, MOSFET's and PIN diodes.

6 Claims, 18 Drawing Sheets

(56) References Cited

FOREIGN PATENT DOCUMENTS

| JP | 2002-520885 | | 7/2002 |
|----|-------------|---|--------|
| JP | 2003-152198 | A | 5/2003 |
| JP | 2003-318412 | A | 11/2003 |
| JP | 2004-193212 | A | 7/2004 |
| JP | 2006-228967 | A | 8/2006 |
| JP | 2009-218543 | A | 9/2009 |
| WO | WO-2007-055352 | A1 | 5/2007 |

* cited by examiner

POWER SEMICONDUCTOR DEVICES AND METHODS FOR MANUFACTURING THE SAME

CROSS-REFERENCE TO RELATED APPLICATIONS

This application is a divisional of application Ser. No. 12/539,295, filed on Aug. 11, 2009. Furthermore, this application claims the benefit of priority of Japanese application 2008-209000, filed Aug. 14, 2008. The disclosures of these prior U.S. and Japanese applications are incorporated herein by reference.

FIELD OF THE INVENTION

The present invention relates to semiconductor devices and methods for manufacturing the semiconductor devices. Specifically, the invention relates to semiconductor devices such as insulated gate bipolar transistors (hereinafter referred to as "IGBT's"), metal oxide semiconductor field effect transistors (hereinafter referred to as "MOSFET's") and PIN diodes that constitute power semiconductor devices. The invention relates also to the methods for manufacturing these power semiconductor devices.

BACKGROUND OF THE INVENTION

Generally, power semiconductor devices have been used as non-contact switches. Therefore, it has been required for the power semiconductor devices to produce lower losses therein. For reducing the losses produced therein, techniques for ON-state voltage lowering and switching loss reduction have been explored. It has been known to persons skilled in the art that there exists a tradeoff relationship between the ON-state voltage and the switching (turnoff) loss of power semiconductor devices. The tradeoff relation is called the "ON-state-voltage turnoff-power-loss tradeoff characteristics" for IGBT's and the "forward-voltage reverse-recovery-loss tradeoff characteristics" for PIN diodes.

These tradeoff characteristics are the indices of loss generation in the power devices that have required improvement. The ON-state-voltage turnoff-power-loss tradeoff characteristics and the soft switching performances are not simultaneously improved very often by the conventional methods known to persons skilled in the art. Therefore, it has been an important problem to improve both the ON-state-voltage turnoff-power-loss tradeoff characteristics and the soft switching performances at the same time. Since the turnoff-power-loss reduction is affected by the high-speed switching performances, it is very important to improve the high-speed switching performances and the soft switching performances at the same time.

The below-listed Patent Document 1 describes a technique for improving both the ON-state-voltage turnoff-power-loss tradeoff characteristics and the soft switching performances by an IGBT. The IGBT includes an n-type silicon layer between first and second major surfaces. The silicon layer includes an n-type region and a p-type region. The IGBT also includes a cathode formed of a first metal film arranged on the first major surface and an anode formed of a second metal film covering the second major surface. The IGBT is a power semiconductor device specifically for high reverse voltage use that includes, as described from the side of the second major surface, a p-type anode region, an n-type field stop layer in contact with the anode region and doped more heavily than the silicon layer, and the silicon layer in contact with the field stop layer. The field stop layer is doped with at least one kind of dopant having at least one donor level between the valence band edge and conduction band edge of silicon and the donor level is far from the conduction band edge of silicon by more than 200 meV. Patent Document 1 describes the use of sulfur and selenium as the dopant.

The below-listed Patent Document 2 proposes a technique for reducing the total losses consisting of a turnoff power loss and a steady state loss and for preventing oscillations from occurring on voltage and current waveforms. The technique disclosed in the Patent Document 2 forms an $n^+$-type buffer region and a first $n^-$-type drift region. The thickness of the first $n^-$-type drift region and the impurity dose amount for forming the $n^+$-type buffer region are determined so that the edge of the depletion layer expanding in the first $n^-$-type drift region, when a rated voltage is applied, may stop in the $n^+$-type buffer region. The technique disclosed in Patent Document 2 further forms a second $n^-$-type drift region spaced apart from the first $n^-$-type drift region by the $n^+$-type buffer region. The thickness of the second $n^-$-type drift region is set at a predetermined value.

The below listed Patent Document 3 describes a technique for improving the forward-voltage reverse-recovery-loss tradeoff characteristics of a diode. The diode includes a first semiconductor layer of a first conductivity type having a first major surface and a second major surface, a second semiconductor layer of the first conductivity type formed on the first major surface and doped more heavily than the first semiconductor layer, and a third semiconductor layer of a second conductivity type formed on the second major surface. The impurity concentration and the thickness of the first and third semiconductor layers are selected so that the electric field caused by a depletion layer expanding from the pn-junction between the first and third semiconductor layers may be almost in the first semiconductor layer in the state of sustaining the breakdown voltage and the depletion layer may reach the second semiconductor layer. The cross-sectional area of at least a portion of the first semiconductor layer parallel to the first major surface thereof is reduced toward the second semiconductor layer from the pn-junction between the first and third semiconductor layers.

The below-listed Patent Document 4 describes a technique for improving the forward-voltage reverse-recovery-loss tradeoff characteristics and the soft switching performances of a PIN-diode. The PIN-diode includes a first n-type drift layer and an n-type buffer layer formed in an n-type drift layer. The shortest distance from the pn-junction between a p-type anode layer and the first n-type drift layer to the n-type buffer layer and the width of the n-type buffer layer are set at respective predetermined values so that a certain breakdown voltage may be secured and the tradeoff relationship between the high-speed switching performance with a low switching loss and the soft recovery performance may be improved.

The below-listed Patent Document 5 proposes another technique for improving the tradeoff relationship between the high-speed switching performance with a low switching loss and the soft recovery performance. The semiconductor device disclosed in Patent Document 5 includes a first semiconductor layer of a first conductivity type; a second semiconductor layer of a second conductivity type formed on the first major surface of the first semiconductor layer, the second semiconductor layer being doped more heavily than the first semiconductor layer; and a third semiconductor layer of the first conductivity type formed on the second major surface of the first semiconductor layer, the third semiconductor layer being doped more heavily than the first semiconductor layer. The first semiconductor layer includes at least a portion in which the impurity concentration shows the maximum value. The impurity concentration in the first semiconductor layer reduces gradually toward the second and third semiconductor layers from the portion in which the impurity concentration shows the maximum value.

The below-listed Patent Document 6 proposes a technique for manufacturing a semiconductor device, which exhibits a high-speed switching performance with a low switching loss and a soft switching performance. Oxygen is introduced into an $n^-$-type FZ wafer that constitutes an $n^-$-type first semiconductor layer. Then, a p-type second semiconductor layer and an anode electrode are formed on the FZ wafer. Protons are irradiated onto the FZ wafer from the anode electrode side to introduce crystal defects into the FZ wafer. Then, a heat treatment is performed to make the crystal defects in the FZ wafer recover for setting the net dopant concentration in a portion of the first semiconductor layer to be higher than the initial net dopant concentration in the FZ wafer and for further forming a desired broad buffer structure. The manufacturing method proposed in Patent Document 6 facilitates manufacturing the semiconductor device, which exhibits the preferable switching performances described above, from an FZ bulk wafer with low manufacturing costs, with excellent controllability, and with high throughput of non-defective products.

The patent documents referenced above are as follows:

[Patent Document 1] Published Japanese Translation of PCT International Publication for Patent Application No. 2002-520885

[Patent Document 2] Japanese Unexamined Patent Application Publication No. 2004-193212

[Patent Document 3] Japanese Patent Publication No. 2573736

[Patent Document 4] Japanese Unexamined Patent Application Publication No. 2003-152198

[Patent Document 5] Japanese Unexamined Patent Application Publication No. 2003-318412

[Patent Document 6] International Unexamined Patent Application Publication No. 2007/055352 Pamphlet For forming a field stop region and such a region doped more heavily than the semiconductor substrate in the semiconductor substrate, it is necessary for the technique described in Patent Document 1 to include a thermal diffusion treatment at a relatively high temperature, higher than 600° C. Especially in manufacturing a device that employs a thin wafer, partings and cracks may be caused in the subsequent metallization step. It is difficult to form only a region doped more heavily than the semiconductor substrate, in the semiconductor substrate. Moreover, the heavily doped region is limited to an n-type region.

According to the technique described in Patent Document 6 for manufacturing a diode, the concentration in the heavily doped region formed in the semiconductor substrate is constant in parallel to the major surface of the semiconductor substrate. In order to form a heavily doped region, the impurity concentration of which changes in parallel to the major surface of the semiconductor substrate, it is necessary to employ a method that includes metal mask alignment, for example, with a relatively low accuracy. By the technique described in Patent Document 6, the heavily doped region formed in the semiconductor substrate is limited to an n-type heavily doped region. The technique described in Patent Document 3, 5 or 6 makes the voltage rise rate (dV/dt) increase as the depletion layer reaches the cathode region or the region doped more heavily than the semiconductor substrate. Therefore, a soft switching performance is not obtained.

In view of the foregoing, it would be desirable to obviate the problems described above. It would be also desirable to provide a semiconductor device that facilitates improving the relevant tradeoff characteristics and obtaining a soft switching performance. It would be further desirable to provide the method for manufacturing the semiconductor device that facilitates improving the relevant tradeoff characteristics and obtaining a soft switching performance. The invention is applicable to an n-type semiconductor substrate as well as to a p-type semiconductor substrate. The invention is applicable to a semiconductor device that includes a heavily doped region in the semiconductor substrate and to the method for forming such a heavily doped region in the semiconductor substrate independently of the conductivity type of the heavily doped region.

SUMMARY OF THE INVENTION

In a first exemplary aspect of the invention, there is provided a method of manufacturing a semiconductor device, the method including the steps of; (a) forming a mask on the first major surface of a semiconductor substrate, the mask having openings formed therein; (b) etching the portions of the semiconductor substrate exposed by the openings of the mask to form trenches in the first major surface of the semiconductor substrate; (c) implanting dopant ions into a semiconductor at the bottoms of the trenches to form impurity layers; (d) activating the impurity layers into which the dopant ions have been implanted; and (e) filling the trenches with a semiconductor. Depending on the design requirements of the semiconductor device being manufactured, the step of activating, step (d) may be used to cause the impurity layers in adjacent trenches to connect.

In addition to steps (a) through (e) described above, the method of manufacturing a semiconductor device according to the present invention further includes the step of (f) flattening the first major surface of the semiconductor substrate, step (f) being performed subsequent to step (e).

In addition to steps (a) through (f) described above, the method further includes the step of (g) flattening the second major surface of the semiconductor substrate, step (g) being performed subsequent to step (f).

With regard to a semiconductor device manufactured according to steps (a) through (f), described above, it is preferable that the semiconductor substrate flattened through step (g) be 150 µm or less in thickness.

Depending on the design requirements of the semiconductor device being manufactured, the method described above may further include: the step of (h) forming an oxide film on the side walls and the bottom plane of each trench, step (h) being performed subsequent to step (b) and prior to step (c); and the step of (k) removing the oxide film, step (k) being performed subsequent to step (c) and prior to step (d).

With regard to additional step (h), described above, it is preferable that the oxide film be 30 nm or more and 100 nm or less in thickness.

Depending on the design requirements of the semiconductor device being manufactured, the method may further include the step of (m) removing the mask, step (m) being performed subsequent to step (d) and prior to step (e).

With regard to a semiconductor device manufactured according to the above-described method, the conductivity type of the dopant is preferably the same as the conductivity type of the semiconductor substrate.

Depending on the design requirements of the semiconductor device being manufactured, the conductivity type of the semiconductor may be the same as the conductivity type of the semiconductor substrate.

Depending on the design requirements of the semiconductor device being manufactured, the impurity concentration in the semiconductor may be almost the same as the impurity concentration in the semiconductor substrate.

Depending on the design requirements of the semiconductor device being manufactured, the impurity concentration in the semiconductor may be different from the impurity concentration in the semiconductor substrate.

Depending on the design requirements of the semiconductor device being manufactured, the conductivity type of the semiconductor may be different from the conductivity type of the semiconductor substrate.

Depending on the design requirements of the semiconductor device being manufactured, the semiconductor may be a single-crystal semiconductor containing silicon as a main component thereof.

In a second exemplary aspect of the invention, there is provided a semiconductor device including: a main semiconductor layer of a first conductivity type, the main semiconductor layer having a first major surface and a second major surface, the main semiconductor layer having an impurity concentration distribution that repeatedly increases and decreases in a direction parallel to the first major surface thereof; an anode layer of a second conductivity type disposed on the first major surface of the main semiconductor layer; an anode electrode disposed on the anode layer; a cathode layer of the first conductivity type disposed on the second major surface of the main semiconductor layer; a cathode electrode disposed on the cathode layer; and a heavily doped layer of the first conductivity type formed between the main semiconductor layer and the cathode layer, the heavily doped layer being doped more heavily than the main semiconductor layer, the heavily doped layer having an impurity concentration distribution that repeatedly increases and decreases in a direction parallel to the first major surface of the main semiconductor layer.

In the semiconductor device according to the second aspect of the invention, the impurity concentration distribution in the main semiconductor layer is produced by lightly doped semiconductor layers and extremely lightly doped semiconductor layers, the lightly doped semiconductor layers being doped more heavily than the extremely lightly doped semiconductor layers, the lightly doped semiconductor layers and the extremely lightly doped semiconductor layers being shaped in cross-section as stripes extending in a direction perpendicular to the first major surface of the main semiconductor layer and arranged alternately and repeatedly in a direction parallel to the first major surface of the main semiconductor layer.

In the semiconductor device according to the second exemplary aspect of the invention, the junction plane between each of the extremely lightly doped semiconductor layers and the anode layer is wider than the junction plane between each of the extremely lightly doped semiconductor layers and the cathode layer.

In a third exemplary aspect of the invention, there is provided a semiconductor device including: a main semiconductor layer, the main semiconductor layer having a first major surface and a second major surface, the main semiconductor layer including first semiconductor layers of a first conductivity type and second semiconductor layers of a second conductivity type, the first semiconductor layers and the second semiconductor layers being arranged alternatively and repeatedly in a direction parallel to the first major surface thereof; a channel region of the second conductivity type formed in the first major surface of the main semiconductor layer on each of the second semiconductor layers; a source region of the first conductivity type and a gate region of the second conductivity type formed in each of the channel regions at the first major surface of the main semiconductor layer; a gate insulator film formed on each channel region between the source region and the adjacent first semiconductor layers; a gate electrode disposed on the gate insulator film; a source electrode in contact with the base region and the source region, with an interlayer insulator interposed between the source electrode and the gate electrode; a substrate layer of the first conductivity type disposed on the second major surface of the main semiconductor layer; a drain layer of the first conductivity type formed on the substrate layer; a drain electrode disposed on the drain layer; and a heavily doped layer of the first conductivity type between the main semiconductor layer and the substrate layer, the heavily doped layer being doped more heavily than the main semiconductor layer, the heavily doped layer having an impurity concentration distribution that repeatedly increases and decreases in a direction parallel to the first major surface of the main semiconductor layer.

In a fourth exemplary aspect of the invention, there is provided a semiconductor device including: a main semiconductor layer of a first conductivity type, the main semiconductor layer having a first major surface and a second major surface, the main semiconductor layer having an impurity concentration distribution that repeatedly increases and decreases in a direction parallel to the first major surface thereof; a channel layer of a second conductivity type disposed on the first major surface of the main semiconductor layer; an emitter region of the first conductivity type formed selectively in the channel layer; a gate electrode formed in the channel layer and in proximity to the emitter region with an insulator film interposed therebetween; an emitter electrode in contact with the channel layer and the emitter region; a collector layer of the second conductivity type disposed on the second major surface of the main semiconductor layer; a collector electrode disposed on the collector layer; and a heavily doped layer of the first conductivity type formed between the main semiconductor layer and the collector layer, the heavily doped layer being doped more heavily than the main semiconductor layer, the heavily doped layer having an impurity concentration distribution that repeatedly increases and decreases in a direction parallel to the first major surface of the main semiconductor layer.

In the semiconductor device according to the fourth exemplary aspect of the invention, the impurity concentration distribution in the main semiconductor layer is produced by lightly doped semiconductor layers and extremely lightly doped semiconductor layers, the lightly doped semiconductor layers being doped more heavily than the extremely lightly doped semiconductor layers, the lightly doped semiconductor layers and the extremely lightly doped semiconductor layers being shaped in cross-section as stripes extending in a direction perpendicular to the first major surface of the main semiconductor layer and arranged alternately and repeatedly in a direction parallel to the first major surface of the main semiconductor layer.

In the invention described above, the impurity layers (hereinafter referred to as the "diffusion layers") formed in the bottoms of the trenches by ion implantation and the subsequent heat treatment may be activated in the activating step, step (d), such that the adjacent diffusion layers are connected to each other. Therefore, a continuous diffusion layer is formed at the desired impurity concentration and with the desired thickness in the depth direction independently of the kinds of the dopant. By changing the depth of the trench, the diffusion layer is formed at the desired location in the semiconductor substrate of the first conductivity type. By changing the conductivity type and the impurity concentration of the semiconductor buried in the trench, a semiconductor substrate that meets the desired design of the semiconductor device is manufactured. In this manner, a semiconductor substrate that provides more degrees of freedom for designing a semiconductor device is manufactured.

The steps, performed after the semiconductor substrate is thinned, are decreased as compared with the conventional manufacturing method for manufacturing a semiconductor substrate. Therefore, the cracks and partings caused in the wafer are reduced. By providing the semiconductor substrate of the first conductivity type with an impurity concentration distribution in parallel to the major surface thereof, a space charge region is prevented from expanding at the time of turnoff by the lightly doped semiconductor layer. The extremely lightly doped semiconductor layer expands the space charge region to eject the electrons and holes quickly. Therefore, the relevant tradeoff characteristics are improved and the soft switching performances are obtained at the same time.

By the semiconductor devices and method for manufacturing the semiconductor devices according to the invention, the relevant tradeoff characteristics are improved and the soft switching performances are obtained at the same time. By the manufacturing method according to the invention, the manufacturing steps for manufacturing a semiconductor device are reduced and a semiconductor substrate that provides more degrees of freedom for designing a semiconductor device is manufactured.

DETAILED DESCRIPTION OF THE PREFERRED MODES FOR CARRYING OUT THE INVENTION

Figure 1:
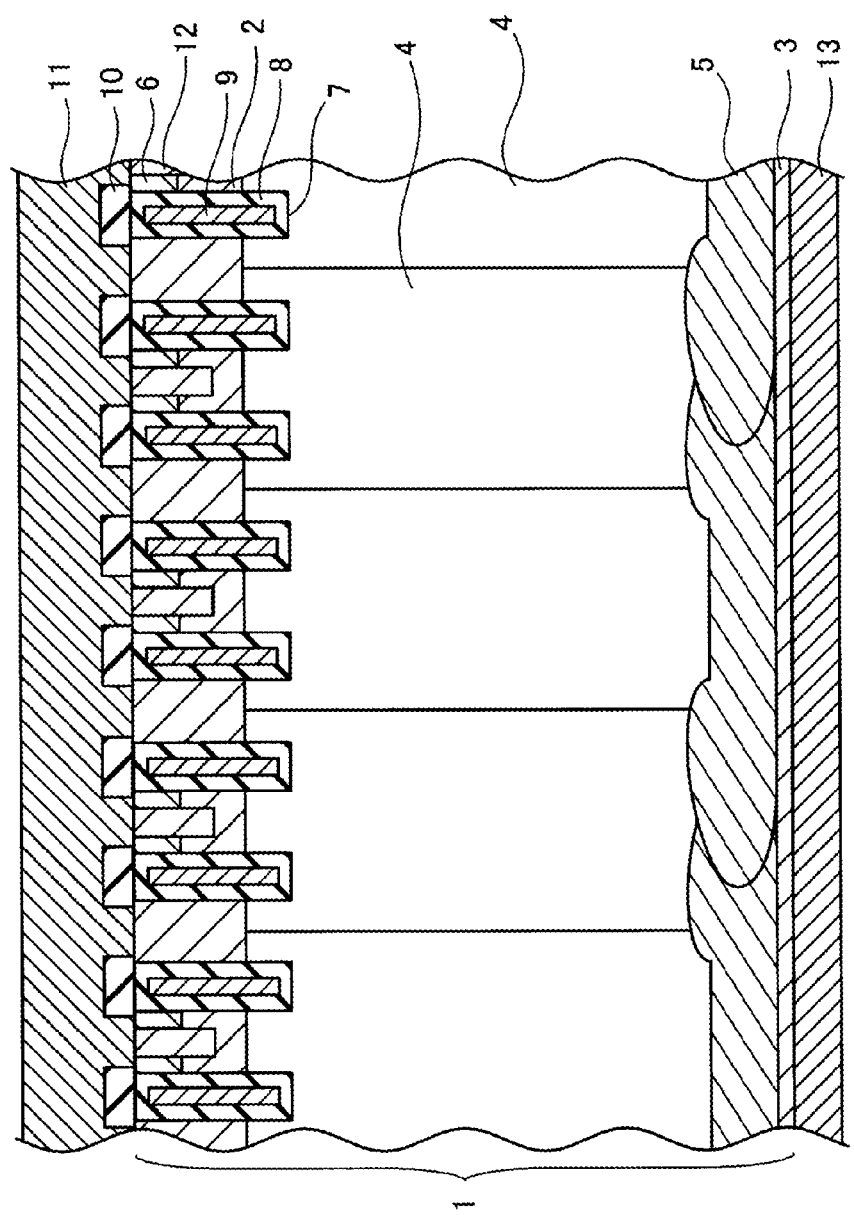
FIG. 1 is a cross-sectional view showing the structure of a semiconductor device according to a first mode for carrying out the invention.

Now the invention will be described in detail hereinafter with reference to the accompanied drawings, which illustrate the preferred modes for carrying out the invention.

In the foregoing and following descriptions, electrons are the majority carriers in the layer or the region with the prefix "n-type". In the layer or the region with the prefix "p-type", holes are the majority carriers. The symbol "+" in superscript after the letter "n" or "p" indicating the conductivity type of the layer or the region, indicates that the layer or the region is doped heavily. The symbol "−" in superscript after the letter "n" or "p" indicating the conductivity type of the layer or the region, indicates that the layer or the region is doped lightly.

Throughout the accompanied drawings, the same reference numerals are used to designate the same constituent elements and their duplicated descriptions are omitted for the sake of simplicity.

First Mode for Carrying Out the Invention

FIG. 1 is a cross-sectional view showing the structure of a semiconductor device according to a first mode for carrying out the invention.

As shown in FIG. 1, the semiconductor device according to the first mode for carrying out the invention is a trench-gate IGBT including a field stop layer. In the surface portion of lightly doped n-type main semiconductor layer 1 on the first major surface side thereof, p-type channel layer (channel region) 2 is formed. In the surface portion of n-type main semiconductor layer 1 on the second major surface side thereof, heavily doped p-type collector layer 3 is formed. In n-type main semiconductor layer 1, n-type base layer 4, in which the impurity concentration distribution is uniform, is formed between p-type channel layer (channel region) 2 and p-type collector layer 3. Between n-type base layer 4 and p-type collector layer 3, $n^+$-type field stop layer 5 is formed.

In the surface portion of p-type channel layer 2, $n^+$-type emitter region 6 is formed selectively. In the surface portion of n-type main semiconductor layer 1 on the first major surface side thereof, stripe-shaped trenches 7 are formed. Trench 7 is formed adjacent to $n^+$-type emitter region 6 and extends from the first major surface of n-type main semiconductor layer 1 into n-type base layer 4 through p-type channel layer 2. Gate electrode 9 is disposed in trench 7 with gate insulator film 8 interposed between gate electrode 9 and the inner wall of trench 7.

On the first major surface of n-type main semiconductor layer 1, interlayer insulator film 10 is formed such that interlayer insulator film 10 covers gate electrode 9. On the first major surface of n-type main semiconductor layer 1, emitter electrode 11 consisting of a metal film is formed such that emitter electrode 11 covering interlayer insulator film 10 is in contact with $n^+$-type emitter region 6. In the surface portion of p-type channel layer 2, $n^+$-type body region 12 is formed selectively. Emitter electrode 11 is connected electrically to p-type channel layer 2 via $p^+$-type body region 12. Collector electrode 13 consisting of a metal film is formed on p-type collector layer 3. Although not illustrated in FIG. 1, a passivation film consisting of a nitride film, an amorphous silicon film or a polyimide film is formed sometimes on emitter electrode 11.

Figure 2:
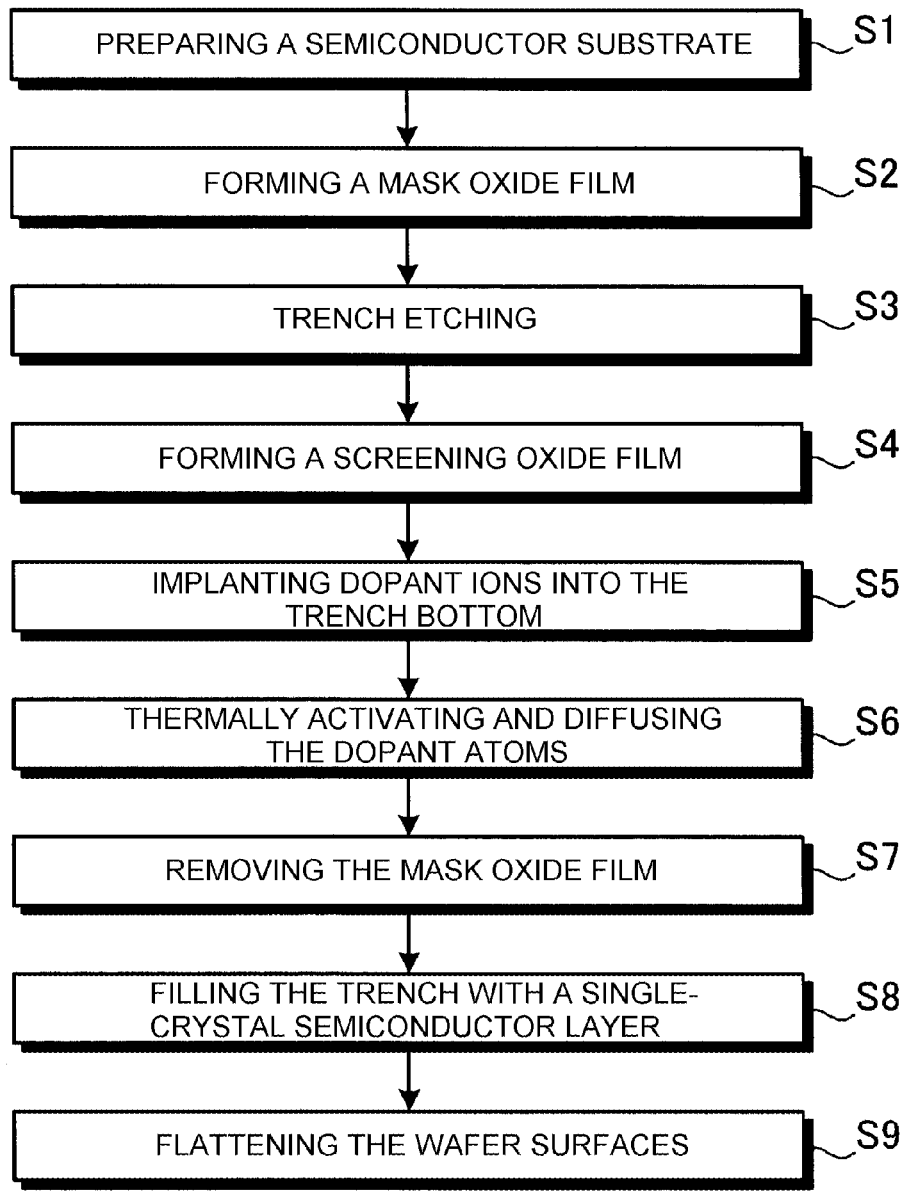
FIG. 2 is a flow chart describing the manufacturing process for manufacturing a semiconductor device according to the invention.

FIG. 2 is a flow chart describing the manufacturing process for manufacturing the semiconductor device according to the invention.

Referring now to FIG. 2, an n-type semiconductor substrate is prepared (step S1). Then, a mask oxide film having openings therein is formed on the first major surface of the n-type semiconductor substrate (step S2). Then, trenches are formed in the n-type semiconductor substrate using the mask oxide film as a trench-etching mask (step S3). Then, dopant ions are implanted into the trench bottoms perpendicular to the first major surface of the n-type semiconductor substrate (step S5). Then, the n-type semiconductor substrate is thermally treated to activate the impurity layer, into which the dopant ions have been implanted (step S6). Then, the trench is filled with an n-type single-crystal semiconductor layer, the impurity concentration of which is almost the same as the impurity concentration in the n-type semiconductor substrate (step S8). Then, the portion of the n-type single-crystal semiconductor layer protruding from the first major surface of the n-type semiconductor substrate and the mask oxide film are removed to flatten the n-type semiconductor substrate (step S9).

According to the first mode for carrying out the invention, the step of forming a screening thermal oxide film on the inner surface (the side walls and the bottom plane) of the trench (Step S4) is not performed. The mask oxide film is not removed in the step of removing the mask oxide film (step S7) according to the first mode but the mask oxide film is removed in the step of flattening the n-type semiconductor substrate (step S9). Therefore, steps S4 and S7 are not performed according to the first mode.

FIGS. 3 through 7 are the cross-sectional views of a wafer describing the manufacturing method according to the first mode for carrying out the invention.

Figure 3:
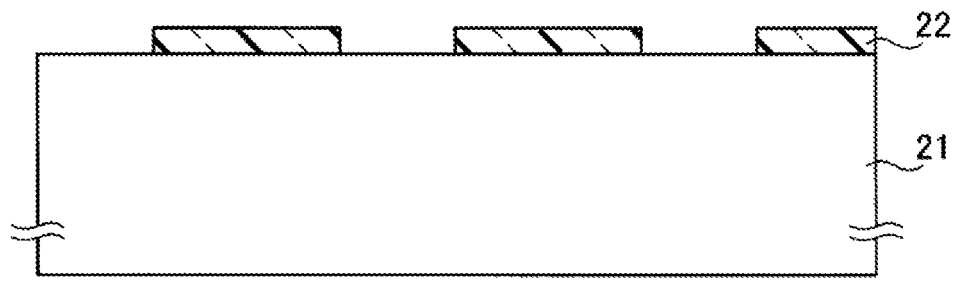
FIG. 3 is a cross-sectional view describing an initial step for manufacturing the semiconductor device according to the first mode for carrying out the invention.

In the steps S1 and S2 described above, first n-type semiconductor substrate 21 is prepared for a starting substrate. After a marker for positioning a photomask on first n-type semiconductor substrate 21 (hereinafter referred to as an "alignment target") is formed, first mask oxide film 22 is formed on the first major surface of first n-type semiconductor substrate 21 as shown in FIG. 3. Then, a part of first mask oxide film 22 is removed by photolithographic and etching techniques to expose a part of first n-type semiconductor substrate 21. For example, first mask oxide film 22 is left in a stripe pattern and the first major surface of first n-type semiconductor substrate 21 is exposed in a stripe pattern.

Figure 4:
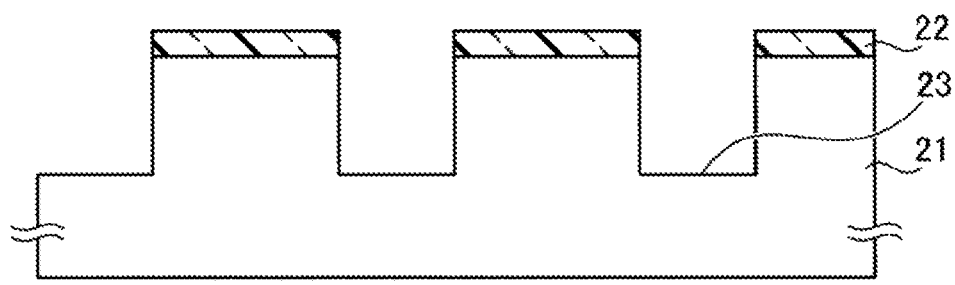
FIG. 4 is a cross-sectional view describing the manufacturing step subsequent to the step described in FIG. 3.

In the step S3 described above, anisotropic etching such as reactive ion etching (hereinafter referred to as "RIE") is performed to form deep trenches 23 in first n-type semiconductor substrate 21 as shown in FIG. 4. Then, the inner surface (the side walls and the bottom plane) of trench 23 is washed with a cleaner such as diluted hydrofluoric acid (hereinafter referred to as "DHF") and buffered hydrogen fluoride (hereinafter referred to as "BHF")

Figure 5:
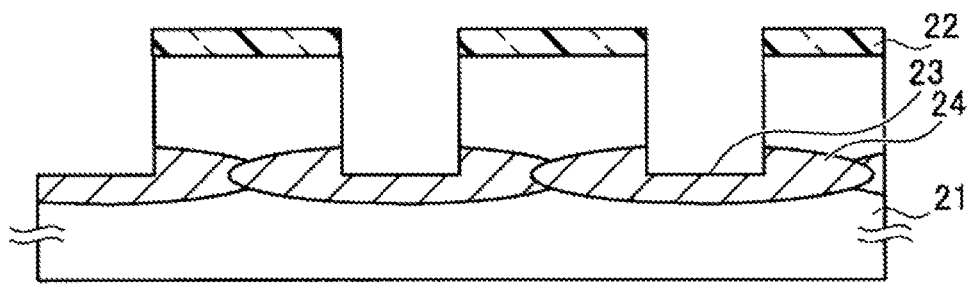
FIG. 5 is a cross-sectional view describing the manufacturing step subsequent to the step described in FIG. 4.

Then, in the steps S5 and S6 described above, ions are implanted in the bottom planes of trenches 23 perpendicular to the first major surface of first n-type semiconductor substrate 21. Then, the implanted atoms are thermally treated to form first diffusion layers 24 in the bottom planes of trenches 23 as shown in FIG. 5. Adjacent first diffusion layers 24 are connected to each other. First diffusion layers 24 correspond to $n^+$-type field stop layers 5 shown in FIG. 1. Then, a sacrifice oxide film is formed on the inner surface of trench 23 and, then, the sacrifice oxide film is removed to remove the damaged layer caused in the inner surface of trench 23 through the formation thereof together with the sacrifice oxide film.

Then, first n-type semiconductor substrate 21 shown in FIG. 5 is transferred into an epitaxial growth furnace not shown and treated thermally at around 1000° C. to wash the first major surface of first n-type semiconductor substrate 21. Subsequently, an etching gas and a carrier gas are fed to the epitaxial growth furnace to clean the inner surfaces of trenches 23. Due to the cleaning, the opening width of trench 23 is a little bit wider than the bottom width of trench 23.

Figure 6:
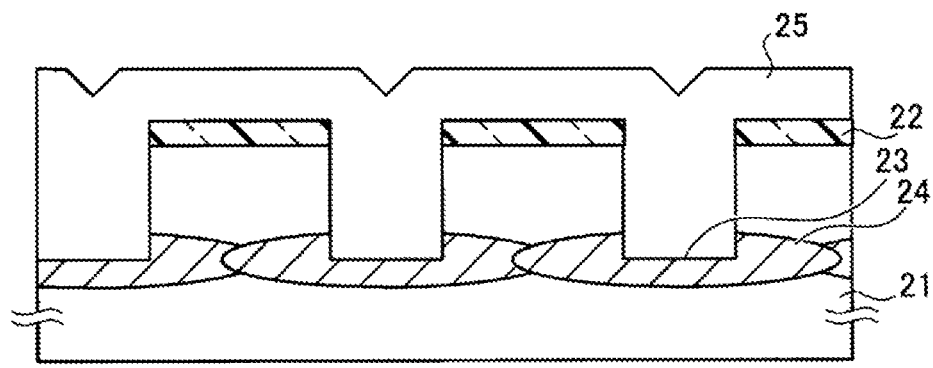
FIG. 6 is a cross-sectional view describing the manufacturing step subsequent to the step described in FIG. 5.
Figure 7:
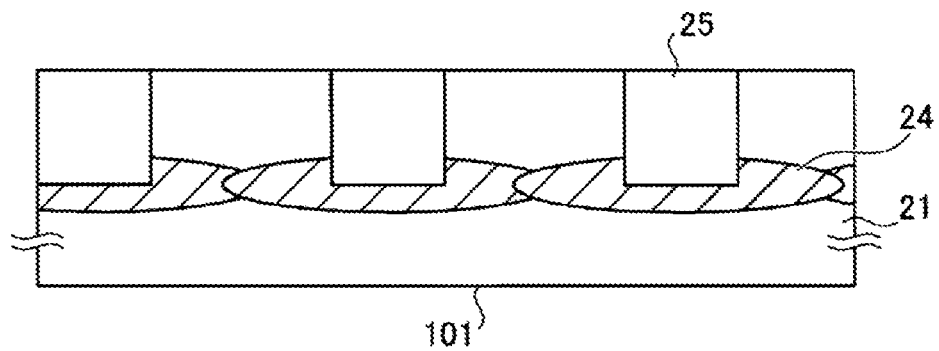
FIG. 7 is a cross-sectional view describing the manufacturing step subsequent to the step described in FIG. 6.

Then, in the step S8 described above, trenches 23 are filled by the epitaxial growth method with first n-type semiconductor 25 without leaving any gap or any void as shown in FIG. 6. The impurity concentration in first n-type semiconductor 25 is almost the same as the impurity concentration in first n-type semiconductor substrate 21.

Then, in the step S9 described above, first n-type semiconductor 25 grown over first mask oxide film 22 is removed by chemical mechanical polishing (hereinafter referred to as "CMP") and such polishing and the polished surface is flattened. Then, first mask oxide film 22 is removed. Semiconductor substrate 101 prepared as described above is used as a manufacturing substrate for manufacturing a semiconductor device.

Although not illustrated, a surface structure, including p-type channel layer 2, $n^+$-type emitter region 6, trench 7, gate insulator film 8, gate electrode 9, interlayer insulator film 10, emitter electrode 11, and p⁺-type body region 12, is formed by the techniques well known to persons skilled in the art on the first major surface side of a manufacturing substrate (semiconductor substrate 101) for manufacturing a semiconductor device. Polishing and etching are conducted on the second major surface of semiconductor substrate 101 to thin semiconductor substrate 101. Then, p-type collector layer 3 is formed by performing ion implantation on the second major surface side and by subsequent heat treatment. The thickness of p-type collector layer 3 is 1 μm or less. Then, collector electrode 13 is formed. If necessary, the first major surface side is covered with a passivation film. Thus, a trench-gate IGBT as shown in FIG. 1 is completed.

In the descriptions of the trench-gate IGBT according to the first mode, the dimensions, impurity concentrations and process conditions are exemplary and not restrictive. The dimensions, impurity concentrations and process conditions for a trench-gate IGBT of the 600 V class will be described below.

An n-type floating zone (hereinafter referred to as "FZ") silicon substrate cut out from a silicon ingot manufactured by the FZ method is used for a starting substrate that is first n-type semiconductor substrate 21. The resistivity of the FZ silicon substrate is 30 Ωcm. The thickness of the FZ silicon substrate is 500 μm. The orientation of the plane of the FZ silicon substrate is (100). The direction of orientation flat of the FZ silicon substrate is <100>. First mask oxide film 22 is formed by a dry oxidation treatment conducted at 1100° C. for 9 hr. First mask oxide film 22 is 1.8 μm in thickness. The opening width of trench 23 is 6 μm and the depth thereof is 70 μm. Trench 23 is not so deep that trench 23 extends through first n-type semiconductor substrate 21. Adjacent trenches 23 are spaced apart for 10 μm.

The conditions in the chamber, in which the step S3 of trench etching is conducted, are described below.

The pressure inside the camber is set at 3 Pa. The gas composition ratio of hydrogen bromide (HBr), sulfur hexafluoride ($SF_6$) and oxygen ($O_2$) is set at 1:2:2. The source power is set at 900 W. The bias power is set at 100 W.

After the step S5, the damaged layer produced on the inner surface of trench 23 is removed with a plasma etcher, by chemical dry etching (hereinafter referred to as "CDE") or by forming a thin sacrifice oxide film of 50 nm or less in thickness on the inner surface of trench 23 and removing the sacrifice oxide film with hydrofluoric acid.

The ion implantation into the bottom of trench 23 is conducted using phosphorus ions ($P^+$) for a dopant at a dose amount of $1 \times 10^{13}$ cm$^{-2}$. First diffusion layer 24 is treated thermally at 1150° C. for 5 hr. A halogen-containing gas such as hydrogen chloride (HCl) is used for an etching gas and hydrogen ($H_2$) for a carrier gas for cleaning the inner surface of trench 23. It is preferable for the temperature inside the chamber to be 1000° C. or higher. It is preferable for the carrier gas pressure inside the chamber to be around 200 Torr.

In the step S8, the semiconductor gases fed into the chamber include trichlorosilane ($SiHCl_3$) for a growth gas, phosphine ($PH_3$) for a doping gas, a gas containing hydrogen chloride for an etching gas, and hydrogen gas for a carrier gas. The growth gas, doping gas and etching gas are used with respect to the carrier gas at the respective ratios of 1:0.1:1.5. It is preferable for the hydrogen gas pressure to be 40 Torr or lower. Semiconductor substrate 101 is 70 μm in thickness. The dopant for forming p-type collector layer 3 is boron (B), for example. Collector electrode 13 is formed by sputtering or by vacuum deposition using aluminum (Al), titanium (Ti), nickel (Ni), and copper (Cu).

By setting the gas phase diffusion length of hydrogen chloride in the step of cleaning the inner surface of trench 23 conducted before the step of filling trench 23, an etching speed difference is caused between the opening and bottom of trench 23. Due to the etching speed difference caused, the opening of trench 23 is a little bit wider than the bottom of trench 23. By using a chlorine-containing growth gas as one of the gases fed into the chamber in the step of filling trench 23, epitaxial growth is conducted while etching is conducted. By the etching, an epitaxial growth speed difference is caused between the opening and bottom of trench 23. Due to the epitaxial growth speed difference caused, it is possible to bury first n-type semiconductor 25 in the bottom of trench 23 before the opening thereof is corked with first n-type semiconductor 25. By virtue of the mechanism described above, it is possible to fill trench 23 with first n-type semiconductor 25 without leaving any gap or any void.

It is preferable to set n-type main semiconductor layer 1 to be 80 μm or less in thickness, since the ON-state resistance can be reduced by thinning n-type main semiconductor layer 1. It is preferable to set the sacrifice oxide film to be 30 nm or more and 100 nm or less in thickness, since the damaged layer is not removed well when the sacrifice oxide film is 30 nm or less in thickness. When the sacrifice oxide film is 100 nm or more in thickness, it takes longer times to form the sacrifice oxide film and to remove the sacrifice oxide film, elongating the total process duration.

According to the first mode for carrying out the invention, first diffusion layer 24 is formed in the bottom of trench 23 by ion implantation and the subsequent heat treatment. Therefore, first diffusion layer 24 can be formed at a desired impurity concentration and at a desired thickness in the depth direction independently of the kinds of dopant. By changing the depth of trench 23, first diffusion layer 24 can be formed at a desired location in first n-type semiconductor substrate 21. Therefore, it is possible to manufacture a semiconductor substrate that provides more degrees of freedom for designing a semiconductor device. By the manufacturing method according to the first mode, the number of the manufacturing steps after thinning the semiconductor substrate is reduced as compared with the conventional method for manufacturing an IGBT. The manufacturing steps reduction facilitates making less partings and cracks to be caused in the wafer. Since it is not necessary to form a field stop layer and such a diffusion layer after thinning the semiconductor substrate, it is not necessary to conduct special steps such as bonding a supporting substrate to the thinned semiconductor substrate and subsequently removing the supporting substrate.

Second Mode for Carrying Out the Invention

Now the manufacturing method for manufacturing a semiconductor device according to a second mode for carrying out the invention will be described below. The descriptions of the second mode and with reference to the attached drawings that duplicate the descriptions of the first mode will be omitted for the sake of simplicity.

Figure 8:
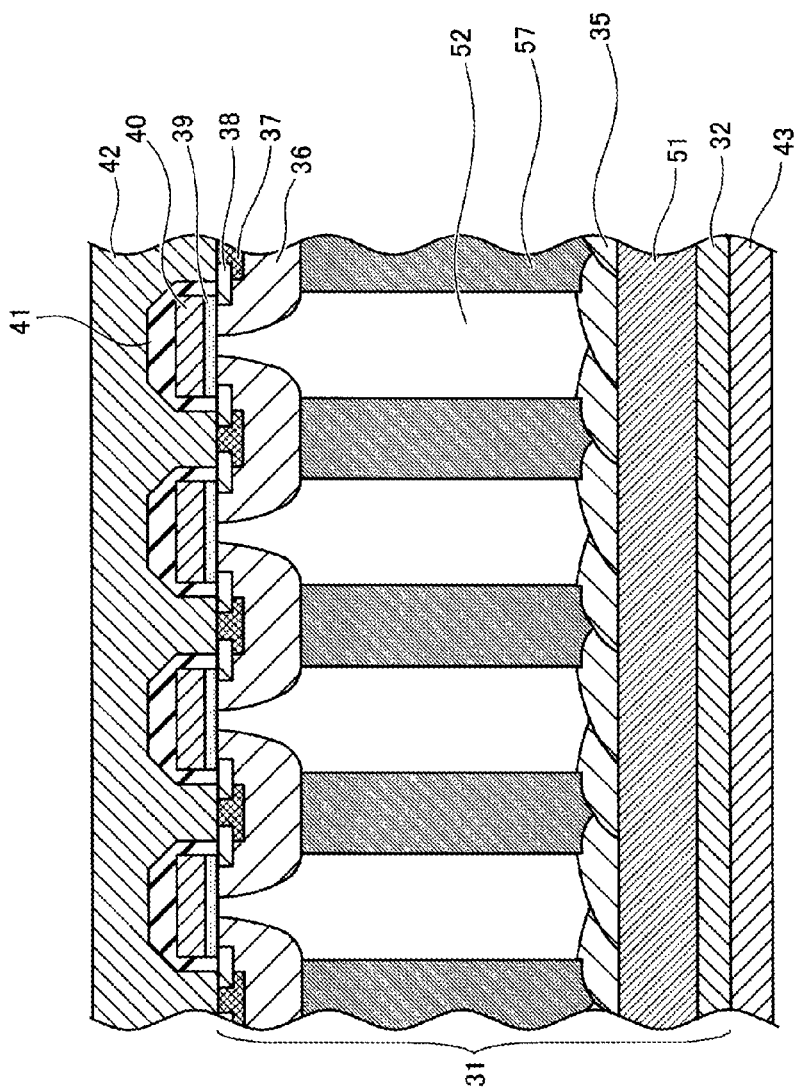
FIG. 8 is a cross-sectional view showing the structure of a semiconductor device according to a second mode for carrying out the invention.

FIG. 8 is a cross-sectional view showing the structure of a semiconductor device according to the second mode. As shown in FIG. 8, the semiconductor device according to the second mode is a super-junction MOSFET including a buffer layer.

As shown in FIG. 8, the super-junction MOSFET includes epitaxial substrate 31 including second n-type semiconductor substrate 51 and n-type epitaxial layer 52 above second n-type semiconductor substrate 51. In the surface portion of epitaxial substrate 31 on the second major surface side thereof, n-type drain layer 32 is formed on second n-type semiconductor substrate 51. Above n-type drain layer 32, an alternating conductivity type structure is formed with second n-type semiconductor substrate 51 interposed between the alternating conductivity type structure and n-type drain layer 32. In the alternating conductivity type structure, n-type epitaxial layer 52 and p-type semiconductor layer 57 in contact with each other are arranged alternately and repeatedly. Between second n-type semiconductor substrate 51 and the alternating conductivity type structure including n-type epitaxial layers 52 and p-type semiconductor layers 57, $n^+$-type buffer layer 35 is formed. On p-type semiconductor layer 57 in the alternating conductivity type structure, p-type channel region 36 is formed. In the surface portion of p-type channel region 36, p-type base region 37 and n-type source region 38 are formed.

Gate insulator film 39 is formed along the surface of p-type channel region 36 between n-type source region 38 and n-type epitaxial layers 52. Gate electrode 40 is formed on gate insulator film 39. Source electrode 42 is in contact with p-type base region 37 and n-type source region 38. Source electrode 42 is insulated from gate electrode 40 by interlayer insulator film 41. Drain electrode 43 is formed on the back surface of epitaxial substrate 31. The semiconductor device having the structure described above is covered with a not-shown surface protector film.

The semiconductor substrate according to the second mode is manufactured in the same manner as the semiconductor substrate according to the first mode. In the manufacturing process according to the second mode, step S4 (of forming a screening oxide film) is performed between step S3 (of forming a trench) and step S5 (of implanting ions into the bottom of the trench). In step S8 (of filling the trenches), the trenches are filled with a semiconductor, the conductivity type of which is different from the conductivity type of the semiconductor substrate prepared as a starting substrate.

FIGS. 9 through 14 are the cross-sectional views of a wafer describing the manufacturing method according to the second mode for carrying out the invention.

Figure 9:
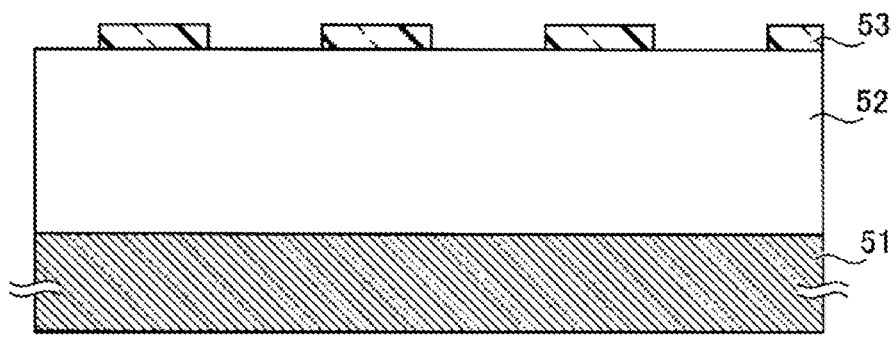
FIG. 9 is a cross-sectional view describing an initial step for manufacturing the semiconductor device according to the second mode for carrying out the invention.

In steps S1 through S3, second n-type semiconductor substrate 51 is prepared for a starting substrate and n-type epitaxial layer 52 is grown on second n-type semiconductor substrate 51 according to the second mode as shown in FIG. 9.

Figure 10:
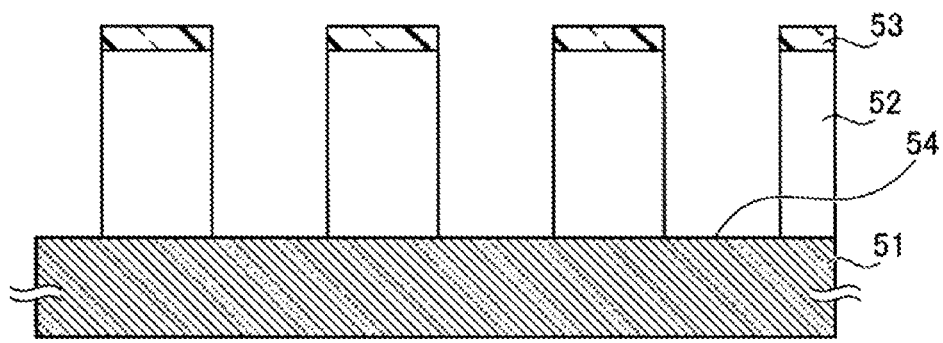
FIG. 10 is a cross-sectional view describing the manufacturing step subsequent to the step described in FIG. 9.

Then, an alignment target is formed in the same manner as according to the first mode. Then, second mask oxide film 53 having openings therein is formed on n-type epitaxial layer 52. Then, deep trenches 54 are formed in n-type epitaxial layer 52 as shown in FIG. 10. The inner surface (the side walls and the bottom plane) of trench 54 is washed.

Figure 11:
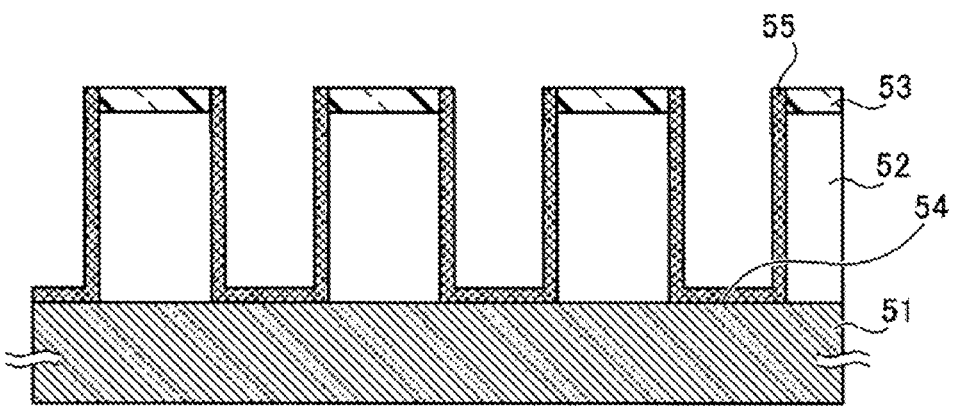
FIG. 11 is a cross-sectional view describing the manufacturing step subsequent to the step described in FIG. 10.
Figure 12:
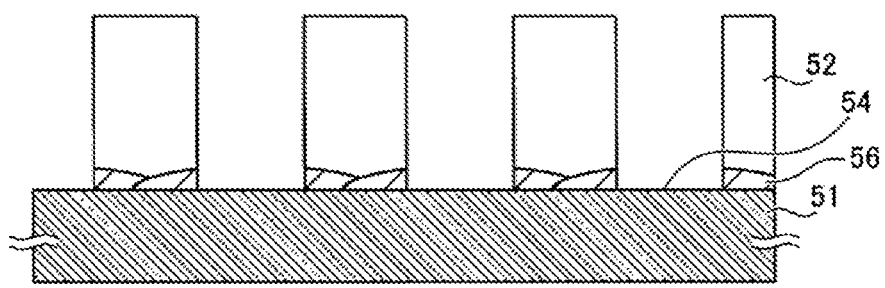
FIG. 12 is a cross-sectional view describing the manufacturing step subsequent to the step described in FIG. 11.

Then, in step S4, screening oxide film 55 is formed on the inner surface of trench 54 as shown in FIG. 11. Then, in steps S5 and S6, ions are implanted into second n-type semiconductor substrate 51 in the bottom of trench 54 through screening oxide film 55 and almost perpendicular to the first major surface of second n-type semiconductor substrate 51. Then, screening oxide film 55 is removed completely as shown in FIG. 12. By forming screening oxide film 55, unnecessary heavy metals are prevented from mixing into the implanted ions.

Second diffusion layer 56 is made to diffuse in a shape similar to the shape of the diffusion layer according to the first mode (diffusion layer 24 in FIG. 5). Since the impurity concentration in second n-type semiconductor substrate 51 is higher than the impurity concentration in second diffusion layer 56, the portion of second diffusion layer 56 diffused inside second n-type semiconductor substrate 51 is not shown in the drawings. Then, a thermal treatment is performed to form second diffusion layers 56 on the boundary planes between second n-type semiconductor substrate 51 and n-type epitaxial layers 52. Second diffusion layers 56 formed as described above correspond to $n^+$-type buffer layers 35 in FIG. 8.

Figure 13:
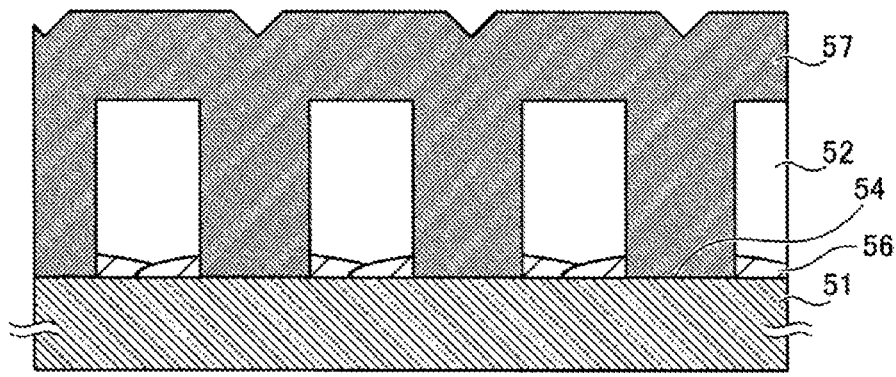
FIG. 13 is a cross-sectional view describing the manufacturing step subsequent to the step described in FIG. 12.
Figure 14:
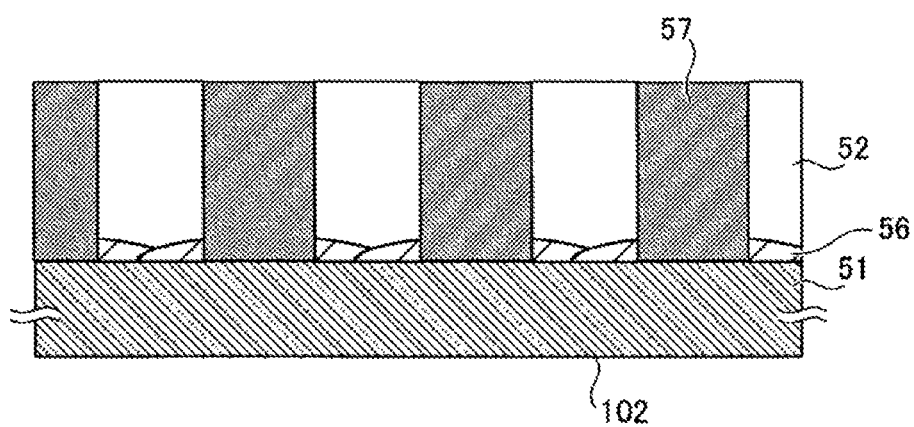
FIG. 14 is a cross-sectional view describing the manufacturing step subsequent to the step described in FIG. 13.

Then, in steps S8 and S9, trenches 54 are filled with second p-type semiconductor 57 without leaving any gap or any void as shown in FIG. 13 and in the same manner as according to the first mode. In filling trenches 54, second p-type semiconductor 57, the conductivity type of which is different than that of n-type epitaxial layer 52, is grown epitaxially. Then, the surface of n-type epitaxial layer 52 is flattened as shown in FIG. 14 and in the same manner as according to the first mode. Semiconductor substrate 102 manufactured as described above is used for a manufacturing substrate for manufacturing a semiconductor device.

Although not illustrated, a surface structure is formed by the methods well known to persons skilled in the art on the first major surface side of the manufacturing substrate (semiconductor substrate 102) for manufacturing a semiconductor device. The surface structure includes p-type channel region 36, p-type base region 37, n-type source region 38, gate insulator film 39, gate electrode 40, interlayer insulator film 41, and source electrode 42.

Etching and polishing are performed on the second major surface of semiconductor substrate 102 to thin semiconductor substrate 102. Then, ion implantation and the subsequent thermal treatment are performed on the second major surface side of semiconductor substrate 102 to lower the contact resistance of second n-type semiconductor substrate 51. The portion of second n-type semiconductor substrate 51, the contact resistance of which is lowered, corresponds to n-type drain layer 32. The thickness of n-type drain layer 32 is 1 µm or less. Then, drain electrode 43 is formed. By the thermal treatment conducted in the manufacturing process for manufacturing the semiconductor device, second diffusion layers 56 diffuse into p-type semiconductor layer 57 such that second diffusion layers 56 are on the boundary between second n-type semiconductor substrate 51 and the alternating conductivity type structure including n-type epitaxial layer 52 and p-type semiconductor layer 57 without causing any gap. Second diffusion layer 56 corresponds to $n^+$-type buffer layer 35. Thus, the super-junction MOSFET shown in FIG. 8 is completed.

In the descriptions of the super-junction MOSFET according to the second mode, the dimensions, impurity concentrations and process conditions are exemplary and not restrictive. The dimensions, impurity concentrations and process conditions for manufacturing a super-junction MOSFET of the 600 V class will be described below.

An n-type silicon substrate cut out from a silicon ingot manufactured by the Czochralski method (hereinafter referred to as the "CZ method") is used for a starting substrate that is second n-type semiconductor substrate 51 according to the second mode. (Hereinafter the n-type silicon substrate cut out from a silicon ingot manufactured by the CZ method will be referred to as the "CZ silicon substrate".) The resistivity of the CZ silicon substrate is 0.01 Ωcm. The thickness of the CZ silicon substrate is 500 µm. The orientation of the plane of the CZ silicon substrate is (100). The direction of orientation flat of the CZ silicon substrate is <100>. The resistivity of n-type epitaxial layer 52 is from 5 to 10 Ωcm. The thickness of n-type epitaxial layer 52 is 55 µm. Second mask oxide film 53 is 1.8 µm in thickness. Trench 54 is 55 µm in depth. Trench 54 is deep enough to extend through n-type epitaxial layer 52. Screening oxide film 55 is 100 nm in thickness.

Diborane ($B_2H_6$) is used for a doping gas fed into the chamber as one of the semiconductor material gases. The dose amount of the ions implanted into the bottom of trench 54 is $1\times10^{14}$ cm$^{-2}$. Semiconductor substrate 102 is 250 μm in thickness. In the ion implantation for forming n-type drain layer 32, arsenic (As) is used as the dopant. Drain electrode 43 is formed by depositing titanium (Ti), nickel (Ni), and gold (Au) in the order of the above description. The other conditions are the same as the conditions according to the first mode.

It is preferable to conduct a treatment for preventing ions from being implanted to the side walls of trench 54. It is also preferable to conduct a treatment for preventing heavy metal ions not preferable for a dopant from being implanted to the bottom of trench 54. In the same manner as according to the first mode, it is preferable to conduct the step of removing the damaged layer caused on the inner surface of the trench by etching. It is also preferable to conduct the step of washing the surface of the semiconductor substrate after forming the trench. It is further preferable to conduct the step of cleaning the inner surface of the trench before conducting the step of filling the trench. By adding these steps, the properties of the semiconductor substrate are improved and the total number of manufacturing steps is reduced. A chlorine-containing gas is used for a growth gas as effectively as according to the first mode.

As described above, the manufacturing method according to the second mode exhibits the same effects as those exhibited by the manufacturing method according to the first mode. Trench 54 is filled with p-type semiconductor layer 57, the conductivity type of which is different than the conductivity type of second n-type semiconductor substrate 51, which is the starting substrate. By filling trench 54 as described above, a semiconductor substrate including an alternating conductivity type layer formed of n-type epitaxial layer 52 and p-type semiconductor layer 57 arranged alternately and repeatedly in parallel to the major surface of second n-type semiconductor substrate 51 is manufactured. In the cross section shown in FIG. 8, n-type epitaxial layer 52 and p-type semiconductor layer 57 are shaped with the respective stripes extending perpendicular to the major surface of second n-type semiconductor substrate 51.

Thus, it is possible to manufacture a semiconductor substrate that provides more degrees of freedom for designing a semiconductor device. Second diffusion layers 56 formed in the manufacturing substrate for manufacturing the semiconductor device are diffused more and made to be more uniform by the heat treatment conducted in the process of manufacturing the semiconductor device. Therefore, it is not necessary to add a treatment for further activating second diffusion layers 56 in forming n$^+$-type buffer layer 35. Even when the depth of trench 54 varies more or less, n$^+$-type buffer layer 35 will be formed with an appropriate thickness between n-type drain layer 32 and the alternating conductivity type structure formed of n-type epitaxial layers 52 and p-type semiconductor layers 57.

Third Mode for Carrying Out the Invention

Figure 15:
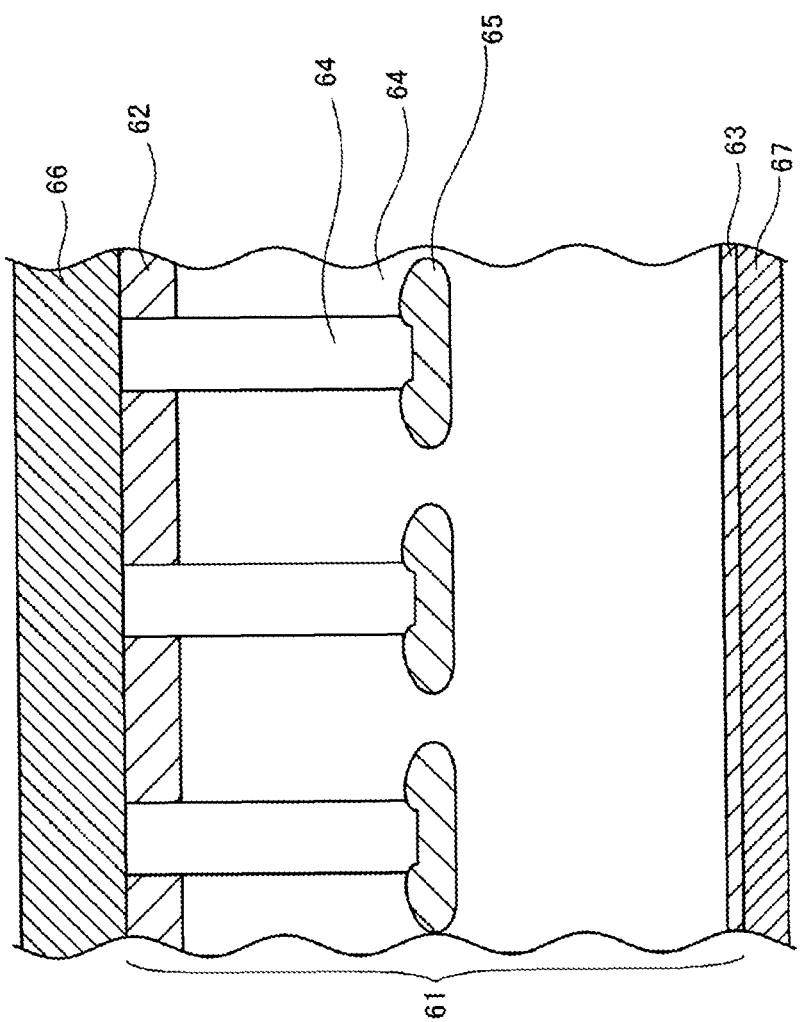
FIG. 15 is a cross-sectional view showing the structure of a semiconductor device according to a third mode for carrying out the invention.

FIG. 15 is a cross-sectional view showing the structure of a semiconductor device according to a third mode for carrying out the invention.

As shown in FIG. 15, the semiconductor device according to the third mode is a PIN diode that includes, in the semiconductor substrate thereof, heavily doped regions doped more heavily than the semiconductor substrate.

As shown in FIG. 15, the PIN diode according to the third mode includes p-type anode layer 62 in the surface portion of lightly doped n-type main semiconductor layer 61 on the first major surface side thereof. The PIN diode according to the third mode also includes heavily doped n-type cathode layer 63 in the surface portion of lightly doped n-type main semiconductor layer 61 on the second major surface side thereof. Uniformly doped second n-type semiconductor layer 64 is between p-type anode layer 62 and n-type cathode layer 63 in n-type main semiconductor layer 61. In second n-type semiconductor layer 64, third n$^+$-type semiconductor layers 65, doped more heavily than second n-type semiconductor layer 64, are disposed. Anode electrode 66 formed of a metal film is disposed on p-type anode layer 62. Cathode electrode 67 formed of a metal film is disposed on n-type cathode layer 63.

Figure 16:
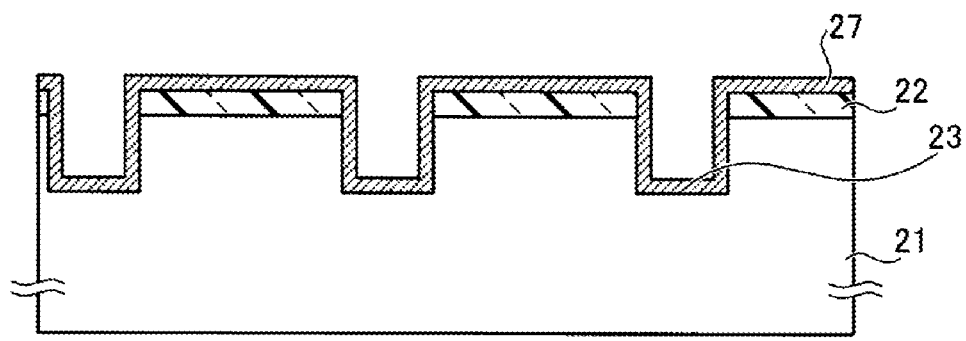
FIG. 16 is a cross-sectional view describing an initial step for manufacturing the semiconductor device according to the third mode for carrying out the invention.
Figure 17:
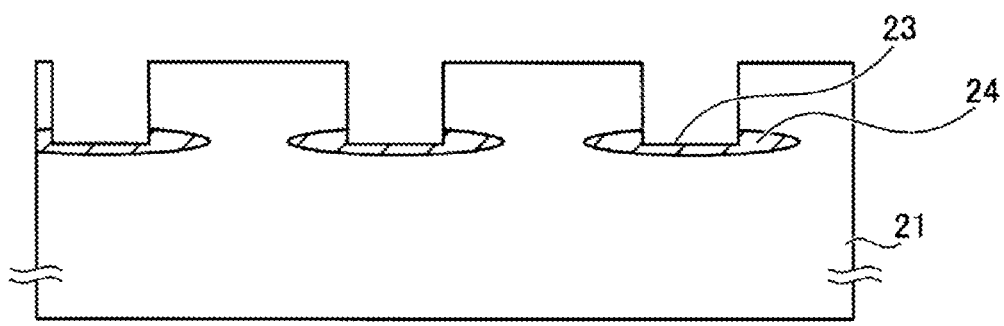
FIG. 17 is a cross-sectional view describing the manufacturing step subsequent to the step described in FIG. 16.
Figure 18:
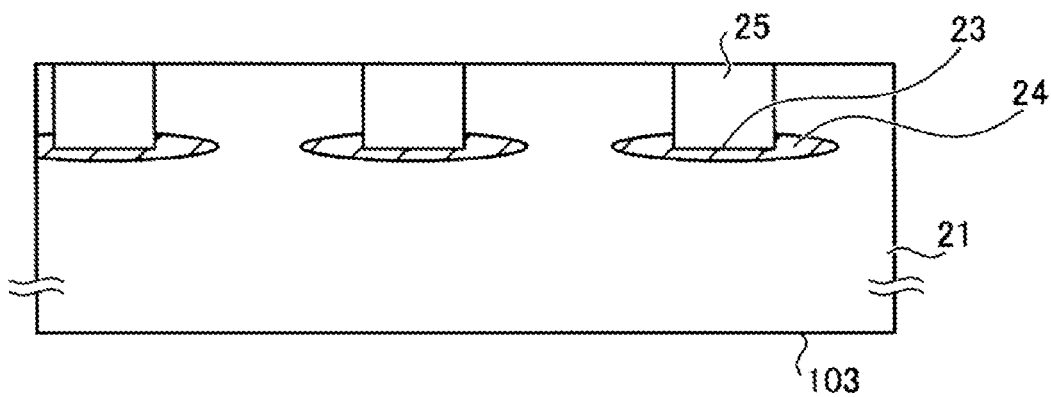
FIG. 18 is a cross-sectional view describing the manufacturing step subsequent to the step described in FIG. 17.

According to the third mode, a semiconductor substrate is manufactured in the same manner as according to the first mode. FIGS. 16 through 18 are the cross-sectional views of a wafer describing the manufacturing method according to the third mode for carrying out the invention.

In steps S1 through S3, first n-type semiconductor substrate 21 is prepared for a starting substrate and an alignment target is formed on first n-type semiconductor substrate 21 according to the third mode. Then, first mask oxide film 22 having openings therein is formed on first n-type semiconductor substrate 21 as shown in FIG. 3. Then, deep trenches 23 are formed in first n-type semiconductor substrate 21 in the same manner as according to the first mode.

As shown in FIG. 16, protector oxide film 27 is formed on the surface of first n-type semiconductor substrate 21 and on the inner surfaces of trenches 23. In steps S5 and S6, ions are implanted almost perpendicular to the first major surface of first n-type semiconductor substrate 21 into the bottom of trench 23. Then, mask oxide film 22 and protector oxide film 27 are removed completely. Then, a heat treatment is conducted to form first diffusion layer 24 in the bottom of trench 23 as shown in FIG. 17. First diffusion layers 24 are formed such that first diffusion layers 24 are isolated from each other. First diffusion layer 24 corresponds to third n$^+$-type semiconductor layer 65 in FIG. 15.

In steps S8 and S9, trench 23 is filled with epitaxially grown first n-type semiconductor 25 without leaving any gap or any void and, then, the surface of first n-type semiconductor substrate 21 is flattened as shown in FIG. 18. Semiconductor substrate 103 obtained as described above is used as a manufacturing substrate for manufacturing a semiconductor device.

Although not illustrated, p-type anode layer 62 is formed by the method well known to persons skilled in the art in the surface portion on the first major surface side of the manufacturing substrate (semiconductor substrate 103) for manufacturing a semiconductor device. Then, anode electrode 66 is formed on p-type anode layer 62. Polishing and etching are conducted on the second major surface of semiconductor substrate 103 to thin semiconductor substrate 103. Then, n-type cathode layer 63 is formed by the ion implantation on the second major surface side and by the subsequent heat treatment. Then, cathode electrode 67 is formed on n-type cathode layer 63. Alternatively, first diffusion layers 24 may be connected to each other by the heat treatment conducted in the process for manufacturing the semiconductor device. First diffusion layer 24 corresponds to third n$^+$-type semiconductor layer 65. Thus, the PIN diode shown in FIG. 15 is completed.

In the descriptions of the PIN diode according to the third mode, the dimensions, impurity concentrations and process conditions are exemplary and not restrictive. The dimensions, impurity concentrations and process conditions for manufacturing a diode of the 600 V class will be described below.

According to the third mode, the resistivity of the FZ silicon substrate is 50 Ωcm. The dry oxidation treatment for forming first mask oxide film 22 is conducted at 1100° C. for 5 hr. First mask oxide film 22 is 1.2 μm in thickness. Protector oxide film 27 is 50 nm in thickness. Trench 23 is 30 μm in depth. Adjacent trenches 54 are spaced apart for 20 μm from each other. The dose amount of the ions implanted into the bottom of trench 23 is $1 \times 10^{12}$ cm$^{-2}$. The resistivity of semiconductor substrate 103 including trenches 23 filled with first n-type semiconductor 25 is 50 Ωcm. Semiconductor substrate 103 is 70 μm in thickness. In the ion implantation for forming n-type cathode layer 63, phosphorus (P) is used as the dopant. The metals for forming cathode electrode 67 are the same as the metals for forming the drain electrode according to the second made. The other conditions are the same as the conditions according to the first mode.

The damaged layer produced during forming trench 23, on the inner surface thereof, can be made to recover by the heat treatment for forming third n$^+$-type semiconductor layer 65.

As described above, the manufacturing method according to the third mode exhibits effects the same as those exhibited by the manufacturing method according to the first mode. By forming first diffusion layers 24, a semiconductor substrate exhibiting an impurity concentration variation in parallel to the first major surface of first n-type semiconductor substrate 21 is manufactured. Thus, it is possible to manufacture a semiconductor substrate that provides more degrees of freedom for designing a semiconductor device.

Fourth Mode for Carrying Out the Invention

Figure 19:
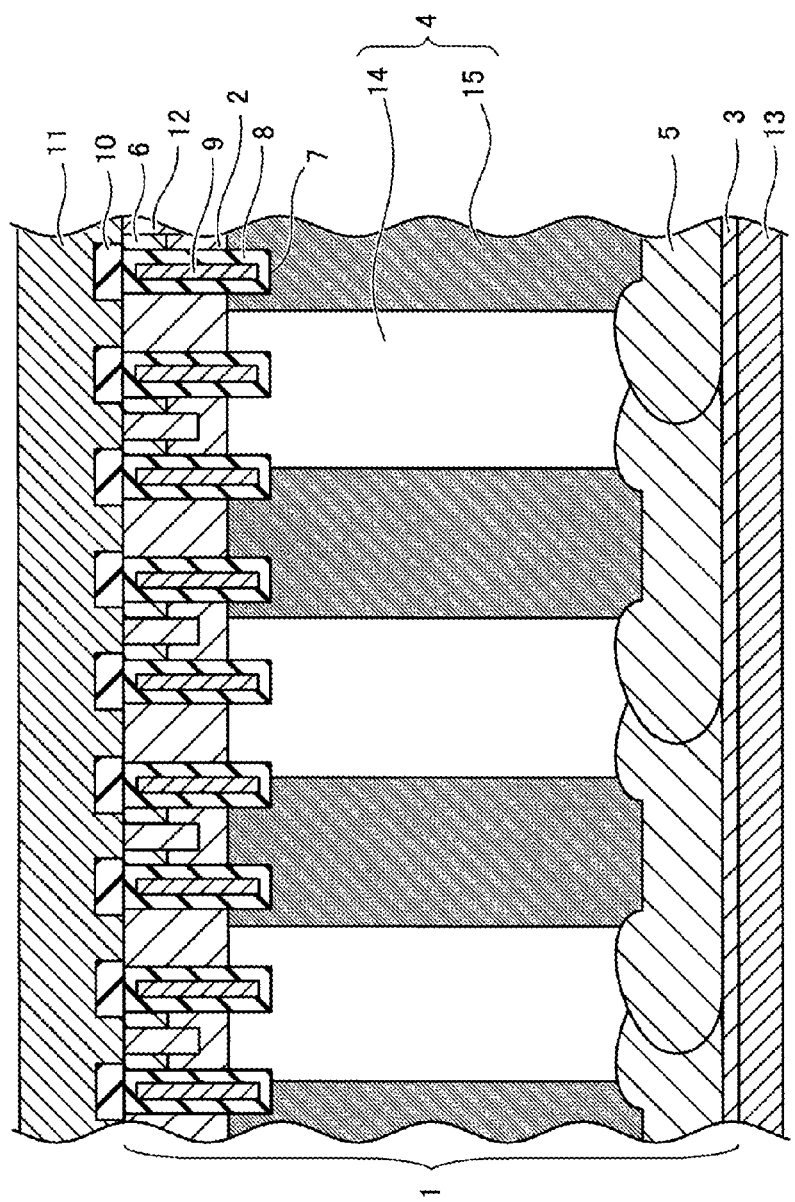
FIG. 19 is a cross-sectional view showing the structure of a semiconductor device according to a fourth mode for carrying out the invention.

FIG. 19 is a cross-sectional view showing the structure of a semiconductor device according to a fourth mode for carrying out the invention.

As shown in FIG. 19, the semiconductor device according to the fourth mode is a trench-gate IGBT that includes a semiconductor substrate including base regions having respective impurity concentrations different from each other and arranged alternately and repeatedly in parallel with the major surface of the semiconductor substrate. The trench-gate IGBT according to the fourth mode has a structure almost the same as the structure of the trench-gate IGBT according to the first mode. N-type base layer 4 in the trench-gate IGBT according to the first mode is replaced by lightly doped n-type base layer 14 and extremely lightly doped n-type base layer 15 in the trench-gate IGBT according to the fourth mode. Extremely lightly doped n-type base layer 15 is doped more lightly than lightly doped n-type base layer 14. Hereinafter, lightly doped n-type base layer 14 will be referred to as "LDN base layer 14" and extremely lightly doped n-type base layer 15 as "XLDN base layer 15". LDN base layer 14 and XLDN base layer 15 in contact with each other are arranged alternately and repeatedly in parallel with the first major surface of n-type main semiconductor layer 1. In the cross section shown in FIG. 19, LDN base layer 14 and XLDN base layer 15 are shaped with their respective stripes extending perpendicular to the first major surface of n-type main semiconductor layer 1.

The manufacturing steps for manufacturing a semiconductor substrate according to the fourth mode are substantially the same as the manufacturing steps for manufacturing the semiconductor substrate according to the first mode. According to the fourth mode, step S7 (of removing the mask oxide film) is conducted between the step S6 (of activating the impurity layer) and the step S8 (of filling the trenches). In the step S8, the trenches are filled with an n-type semiconductor, the impurity concentration of which is different from the impurity concentration in the n-type semiconductor substrate prepared for a starting substrate.

Figure 20:
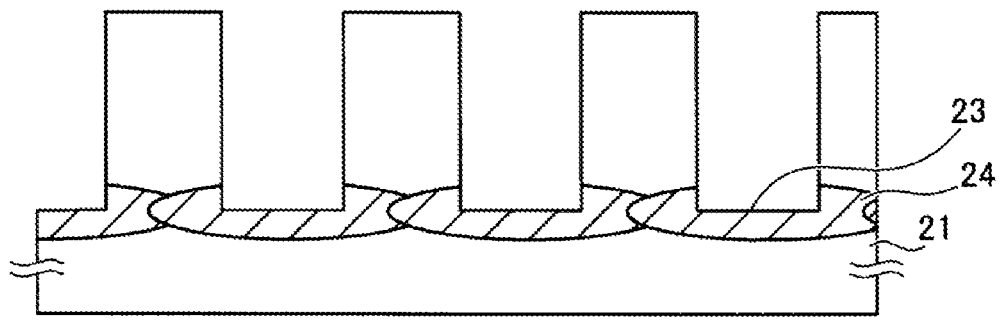
FIG. 20 is a cross-sectional view describing an initial step for manufacturing the semiconductor device according to the fourth mode for carrying out the invention.
Figure 21:
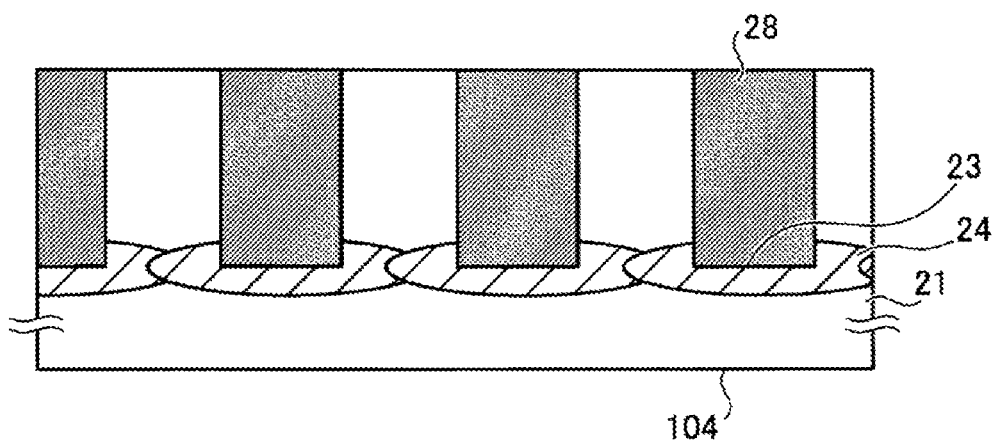
FIG. 21 is a cross-sectional view describing the manufacturing step subsequent to the step described in FIG. 20.

FIGS. 20 and 21 are the cross-sectional views of a wafer describing the manufacturing method for manufacturing the semiconductor device according to the fourth mode.

In steps S1 through S6, an alignment target is formed on first n-type semiconductor substrate 21 prepared for a starting substrate in the same manner as according to the first mode. Then, first mask oxide film 22 having openings formed therein is formed on first n-type semiconductor substrate 21 as shown in FIG. 3. Then, deep trenches 23 are formed, as shown in FIG. 4, in first n-type semiconductor substrate 21 in the same manner as according to the first mode. The impurity concentration in first n-type semiconductor substrate 21 is almost the same with the impurity concentration in LDN base layer 14. Then, a not-shown protector oxide film is formed on the surface of first mask oxide film 22 and on the inner surfaces of trenches 23. Then, ion implantation and thermal diffusion are conducted to form first diffusion layer 24 in the bottom of trench 23 as shown in FIG. 5 according to the fourth mode. First diffusion layer 24 corresponds to n$^+$-type field stop layer 5 in FIG. 19.

Then, in step S7, first mask oxide film 22 is removed completely as shown in FIG. 20. Then, in the steps S8 and S9, trenches 23 are filled with second n-type semiconductor 28 without leaving any gap not any void as shown in FIG. 21 in the same manner as according to the first mode. According to the fourth mode, trenches 23 are filled with second n-type semiconductor 28, the impurity concentration of which is lower than the impurity concentration in first n-type semiconductor substrate 21. The impurity concentration in second n-type semiconductor 28 is almost the same as the impurity concentration in XDLN base layer 15. Then, second n-type semiconductor 28 extending outward from the first major surface of first n-type semiconductor substrate 21 is removed and the first major surface of first n-type semiconductor substrate 21 is flattened. Semiconductor substrate 104 obtained as described above is used as a manufacturing substrate for manufacturing a trench-gate IGBT. The subsequent steps are conducted in the same manner as according to the first mode. Thus, a trench-gate IGBT is completed as shown in FIG. 19.

For manufacturing a manufacturing substrate (semiconductor substrate 104) from a starting substrate (first n-type semiconductor substrate 21), various techniques known to persons skilled in the art are applicable in the same manner as according to the first mode. For example, a thin semiconductor layer is grown epitaxially on the first major surface of a starting substrate. Impurity ions are implanted into some portions of the epitaxial growth layer such that impurity concentration variations are caused in the epitaxial growth layer plane. The step of epitaxial growth and the step of ion implantation are repeated so that a lightly doped semiconductor layer and an extremely lightly doped semiconductor layer may be arranged alternately. The conductivity type of the lightly doped semiconductor layer is the same as the conductivity type of the extremely lightly doped semiconductor layer. But, the impurity concentration in the lightly doped semiconductor layer is different than (higher than) the impurity concentration in the extremely lightly doped semiconductor layer.

In the descriptions of the trench-gate IGBT according to the fourth mode, the dimensions, impurity concentrations and process conditions are exemplary and not restrictive. The dimensions, impurity concentrations and process conditions for manufacturing a trench-gate IGBT of the 1200 V class will be described below.

According to the fourth mode, the resistivity of the FZ silicon substrate is 500 Ωcm. The dry oxidation treatment for forming first mask oxide film 22 is conducted at 1100° C. for 18 hr. First mask oxide film 22 is 2.4 μm in thickness. The opening width of trench 23 is 10 μm and the depth thereof is 120 μm. The protector oxide film is 30 nm in thickness. The dose amount of the ions implanted into the bottom of trench 23 is $5 \times 10^{12}$ cm$^{-2}$. The resistivity of semiconductor substrate 104 including trenches 23 filled with second n-type semiconductor 28 is 30 Ωcm. Semiconductor substrate 104 is 150 μm or less in thickness. Typically, semiconductor substrate 104 is 120 μm in thickness. The other conditions are the same as the conditions according to the first mode.

According to the fourth mode, the impurity concentration of first n-type semiconductor substrate 21 used for a starting substrate is set to be the same as the impurity concentration of LDN base layer 14. Alternatively, the impurity concentration of first n-type semiconductor substrate 21 may be set to be the same as the impurity concentration of XLDN base layer 15 with no problem. And, the impurity concentration of second semiconductor 28 may be set to be the same as the impurity concentration of LDN base layer 14 with no problem.

As described above, the manufacturing method according to the fourth mode exhibits the same effects as those exhibited by the manufacturing method according to the first mode. According to the fourth mode, n-type base layer 4 is replaced by a semiconductor layer including first n-type semiconductor substrate 21 and second semiconductor 28 arranged alternately and repeatedly. Therefore, it is possible to manufacture a semiconductor substrate, in which impurity concentration variations are produced in a direction parallel to the first major surface of first n-type semiconductor substrate 21. In n-type base layer 4, the impurity is uniformly distributed perpendicular to the major surface of the semiconductor substrate. Therefore, the same effect will be obtained, even if the semiconductor substrate is thinned. Thus, it is possible to manufacture a semiconductor substrate that provides more degrees of freedom for designing a semiconductor device more than the design freedoms according to the first and third modes.

Fifth Mode for Carrying Out the Invention

Figure 22:
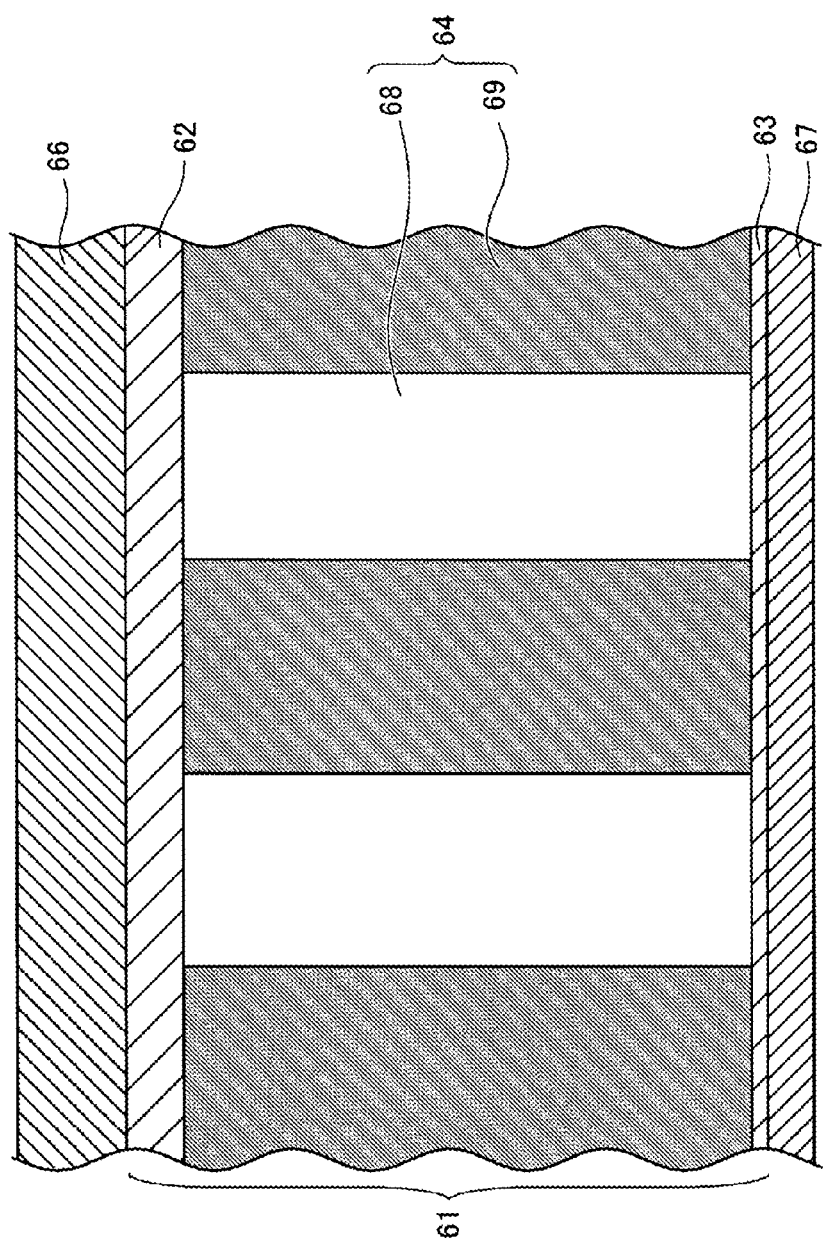
FIG. 22 is a cross-sectional view showing the structure of a semiconductor device according to a fifth mode for carrying out the invention.

FIG. 22 is a cross-sectional view showing the structure of a semiconductor device according to a fifth mode for carrying out the invention.

As shown in FIG. 22, the semiconductor device according to the fifth mode for carrying out the invention is a PIN diode that includes a semiconductor substrate including a pair of semiconductor layers, the impurity concentrations of which are different from each other. The semiconductor layers are arranged alternately and repeatedly in a direction parallel to the major surface of the semiconductor substrate. In the PIN diode according to the fifth mode, second n-type semiconductor layer 64 in the PIN diode according to the third mode is formed of lightly doped n-type semiconductor layer (hereinafter referred to as "LDN layer") 68 and extremely lightly doped n-type semiconductor layer (hereinafter referred to as "XLDN layer") 69. XLDN layer 69 is doped more lightly than LDN layer 68. In the cross section shown in FIG. 22, LDN layer 68 and XLDN layer 69 are shaped with their respective stripes extending perpendicular to the first major surface of n-type main semiconductor layer 61. LDN layer 68 and XLDN layer 69 are arranged alternately and repeatedly in parallel to the first major surface of n-type main semiconductor layer 61. In the PIN diode according to the fifth mode, p-type anode layer 62, n-type cathode layer 63, anode electrode 66, and cathode electrode 67 are disposed in the same manner as in the PIN diode according to the third mode.

The manufacturing steps for manufacturing a semiconductor substrate according to the fifth mode are substantially the same as the manufacturing steps for manufacturing a semiconductor substrate according to the first mode. However, according to the fifth mode, step S5 (of implanting ions into the bottom of the trench) and step S6 (of activating the impurity layer) are not performed. In step S8, the trenches are filled with an n-type semiconductor, the impurity concentration of which is different than the impurity concentration in the n-type semiconductor substrate prepared for the starting substrate, in the same manner as according to the fourth mode.

Figure 23:
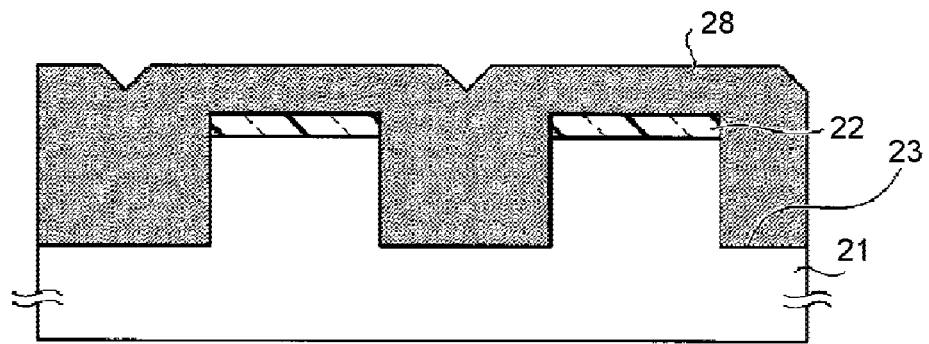
FIG. 23 is a cross-sectional view describing an initial step for manufacturing the semiconductor device according to the fifth mode for carrying out the invention.
Figure 24:
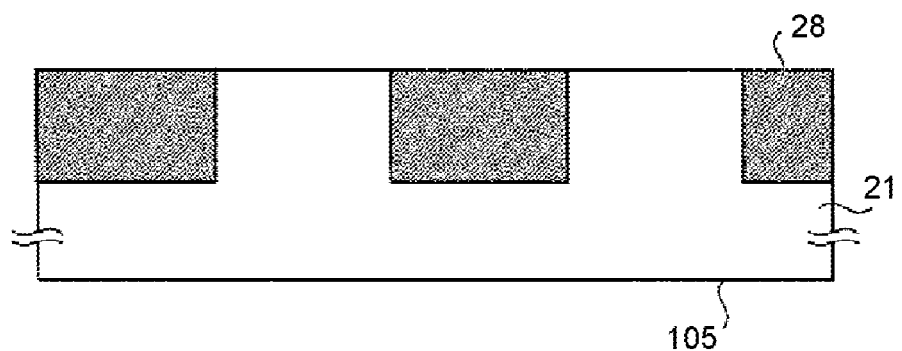
FIG. 24 is a cross-sectional view describing the manufacturing step subsequent to the step described in FIG. 23.

FIGS. 23 and 24 are the cross-sectional views of a wafer describing the manufacturing method for manufacturing the semiconductor device according to the fifth mode.

In steps S1 through S3, an alignment target is formed on first n-type semiconductor substrate 21 prepared as a starting substrate in the same manner as according to the first mode. Then, first mask oxide film 22 having openings therein is formed on first n-type semiconductor substrate 21 as shown in FIG. 3. Then, deep trenches 23 are formed in first n-type semiconductor substrate 21 in the same manner as according to the first mode. The inner surface of trench 23 is washed. Then, the first major surface of first n-type semiconductor substrate 21 is washed and the inner surface of trench 23 is cleaned in the same manner as according to the first mode.

Then, in steps S8 and S9, trenches 23 are filled with second n-type semiconductor 28 without leaving any gap or any void as shown in FIG. 23 and in the same manner as according to the fourth mode. Then, the first major surface of first n-type semiconductor substrate 21 is flattened as shown in FIG. 24, in the same manner as according to the first mode.

Semiconductor substrate 105 obtained as described above is used as a manufacturing substrate for manufacturing a PIN diode. The subsequent steps are performed in the same manner as according to the third mode. Thus, a PIN diode is completed as shown in FIG. 22.

In the descriptions of the PIN diode according to the fifth mode, the dimensions, impurity concentrations and process conditions are exemplary and not restrictive.

According to the fifth mode, the resistivity of the FZ silicon substrate is 40 Ωcm. The dry oxidation treatment for forming first mask oxide film 22 is performed at 1100° C. for 18 hr. First mask oxide film 22 is 2.4 μm in thickness. The opening width of trench 23 is 10 μm and the depth thereof is 130 μm. The dose amount of the ions implanted for forming p-type anode layer 62 is $2 \times 10^{13}$ cm$^{-2}$. The heat treatment for forming p-type anode layer 62 is performed at 1100° C. for 5 hr. The resistivity of XLDN layer 69 buried in the trenches is 500 Ωcm. Semiconductor substrate 105 is 130 μm in thickness. For forming n-type cathode layer 63, phosphorus (P) is used as the dopant. The dose amount of phosphorus for forming n-type cathode layer 63 is $1 \times 10^{15}$ cm$^{-2}$. The other conditions are the same as the conditions according to the first mode.

As described above, the manufacturing method according to the fifth mode exhibits effects the same as those exhibited by the manufacturing method according to the fourth mode.

Sixth Mode for Carrying Out the Invention

Figure 25:
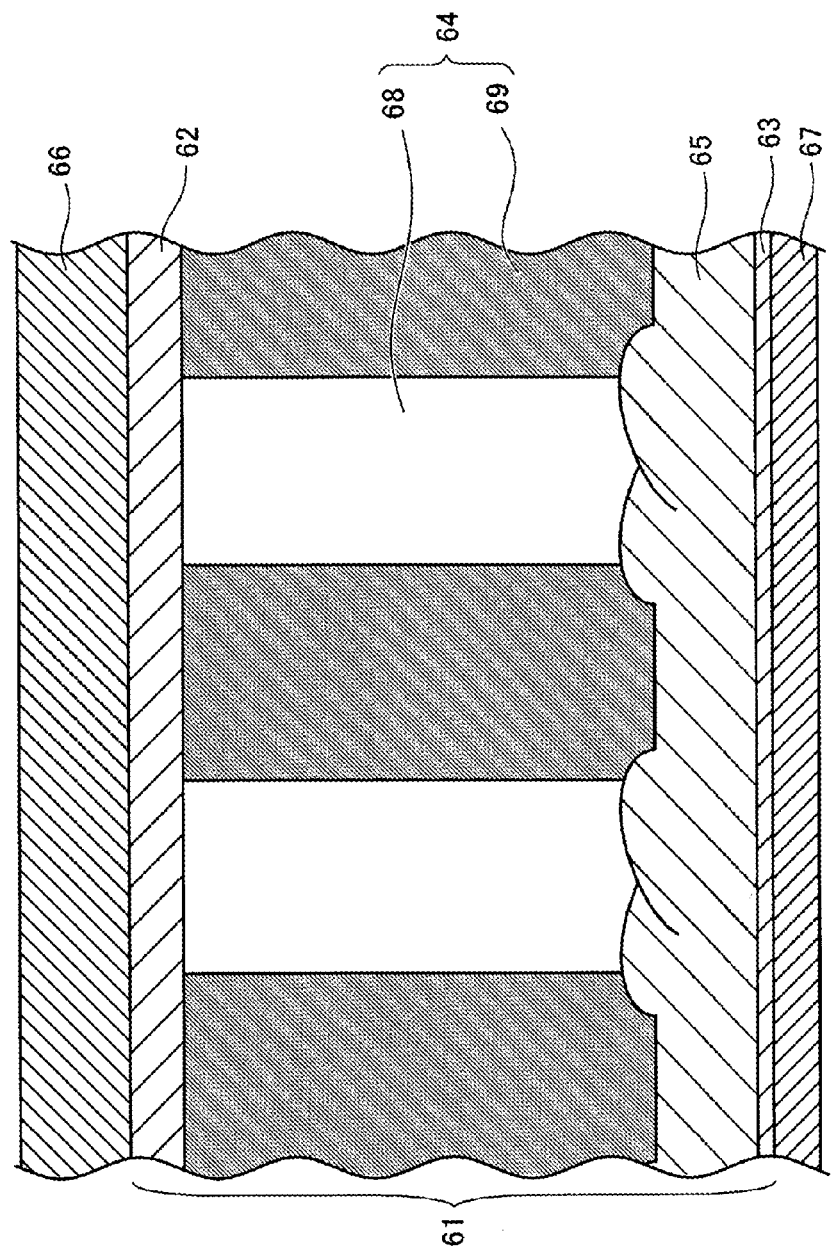
FIG. 25 is a cross-sectional view showing the structure of a semiconductor device according to a sixth mode for carrying out the invention.

FIG. 25 is a cross-sectional view showing the structure of a semiconductor device according to a sixth mode for carrying out the invention.

As shown in FIG. 25, the semiconductor device according to the sixth mode for carrying out the invention is a PIN diode that includes third $n^+$-type semiconductor layer 65 additionally disposed between n-type cathode layer 63 and an alternating conductivity type layer including LDN layer 68 and XDLN layer 69 arranged alternately and repeatedly.

The manufacturing steps for manufacturing a semiconductor substrate according to the sixth mode are substantially the same as the manufacturing steps for manufacturing a semiconductor substrate according to the first mode. In the step S8, the trenches are filled with an n-type semiconductor, the impurity concentration of which is different than the impurity concentration in the n-type semiconductor substrate prepared for a starting substrate in the same manner as according to the fifth mode. The semiconductor substrate obtained as described above is used for a manufacturing substrate for manufacturing a PIN diode. The subsequent steps are conducted in the same manner as according to the third mode. Finally, a PIN diode is completed as shown in FIG. 25.

In the descriptions of the PIN diode according to the sixth mode, the dimensions, impurity concentrations and process conditions are exemplary and not restrictive.

According to the sixth mode, phosphorus (P) or selenium (Se) is used as the dopant for forming third $n^+$-type semiconductor layer 65. The dose amount of the ions for forming third $n^+$-type semiconductor layer 65 is $5 \times 10^{12}$ cm$^{-2}$. The diffusion length for forming third $n^+$-type semiconductor layer 65 is around 10 µm. The other conditions are the same as the conditions according to the fifth mode.

As described above, the manufacturing method according to the sixth mode exhibits effects the same as those exhibited by the manufacturing methods according to the first and fifth modes.

Seventh Mode for Carrying Out the Invention

Figure 26:
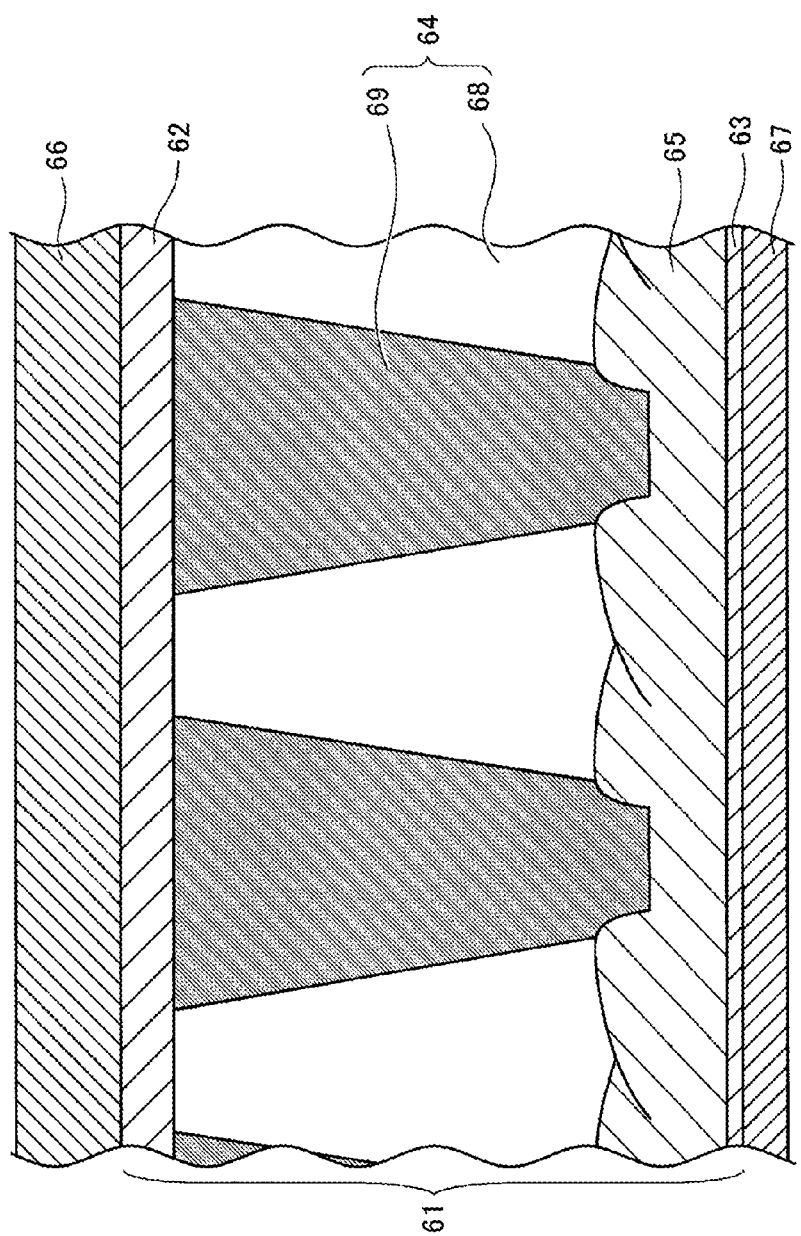
FIG. 26 is a cross-sectional view showing the structure of a semiconductor device according to a seventh mode for carrying out the invention.

FIG. 26 is a cross-sectional view showing the structure of a semiconductor device according to a seventh mode for carrying out the invention.

In the semiconductor device according to the seventh mode shown in FIG. 26, XLDN layer 69 that is wider at its juncture with p-type anode layer 62 than at its juncture with n-type cathode layer 63.

The manufacturing steps for manufacturing a semiconductor substrate according to the seventh mode are the same as the manufacturing steps for manufacturing a semiconductor substrate according to the sixth mode. In step S3, trench 23 is formed such that the opening width of trench 23 is wider than the bottom width thereof. The subsequent steps are conducted in the same manner as according to the third mode. Finally, a PIN diode is completed as shown in FIG. 26.

In the descriptions of the PIN diode according to the seventh mode, the dimensions, impurity concentrations and process conditions are exemplary and not restrictive.

According to the seventh mode, the resistivity of the FZ silicon substrate is 40 Ωcm, and the resistivity of the lightly doped n-type semiconductor layer 68 is 40 Ωcm for example. The resistivity of XLDN layer 69 buried in the trench is 500 Ωcm. The other conditions are the same as the conditions according to the sixth mode.

As described above, the manufacturing method according to the seventh mode exhibits effects the same as those exhibited by the manufacturing methods according to the first and fifth modes.

Embodiments

A PIN diode is manufactured by the manufacturing method according to the fifth mode for carrying out the invention. An n-type floating-zone silicon substrate cut out from a silicon ingot prepared by the floating zone method (hereinafter referred to as the "FZ method") is used as a starting substrate. (Hereinafter the floating-zone silicon substrate will be referred to as the "FZ silicon substrate".) The resistivity of the FZ silicon substrate is 40 Ωcm. The thickness of the FZ silicon substrate is 500 µm. The orientation of the plane of the FZ silicon substrate is (100). The direction of orientation flat of the FZ silicon substrate is <100>.

A mask oxide film of 2.4 µm in thickness is formed, for example, by a thermal oxidation treatment on the first major surface of the FZ silicon substrate. Then, the mask oxide film is removed by photolithographic and etching techniques for a width of 10 µm and with spaces of 10 µm to expose the first major surface of the FZ silicon substrate in a stripe pattern. Then, the silicon layer is removed in rectangular shapes to the depth of around 130 µm by anisotropic etching such as RIE using the remaining mask oxide film for a mask to form stripe-shaped deep trenches in the FZ silicon substrate. The portions of the FZ silicon substrate between the trenches provide LDN layers.

Then, epitaxial growth is performed to fill the trenches in the FZ silicon substrate with an n-type semiconductor having a resistivity of 500 Ωcm. The epitaxial growth layers comprise the XLDN layers of the device. Then, polishing such as CMP is performed to remove the epitaxial growth layer grown over the mask oxide film and the polished plane is flattened. Thus, a manufacturing substrate for manufacturing a semiconductor device is obtained. A PIN diode having the structure shown in FIG. 22 is manufactured using the manufacturing substrate obtained as described above. After forming the anode side structure (front surface structure) of the diode, the substrate is polished and etched from the back surface side thereof to thin the substrate to around 130 µm in thickness. This substrate thickness is the thickness of the n-type main semiconductor layer. Then, the cathode side structure (back surface structure) of the diode is formed. The PIN diode manufactured as described above and having the structure shown in FIG. 22 will be designated as the "first diode".

A PIN diode according to the sixth mode is manufactured utilizing the steps by means of which the first diode is manufactured, and additional steps performed after the stripe-shaped deep trenches are formed. The additional steps of implanting ions and thermally treating the implanted atoms are performed to form a diffusion layer in the bottom of the trenches. The PIN diode manufactured as described above and having the structure shown in FIG. 25 will be designated as the "second diode".

A PIN diode according to the seventh mode is manufactured in the same manner as the second diode except that the opening of the trench is made wider than the bottom thereof. The PIN diode manufactured as described above and having the cross-sectional structure shown in FIG. 26 will be designated as the "third diode". In the third diode, the resistivity of the FZ silicon substrate is 40 Ωcm and the trench in the FZ silicon substrate is filled with a semiconductor, the resistivity of which is 500 Ωcm.

A fourth PIN diode is manufactured as a comparative example. The comparative PIN diode is a diode according to the first embodiment but the impurity concentration distribution in the FZ silicon substrate thereof is uniform. The comparative diode manufactured as described above will be designated as the "conventional diode".

Figure 27:
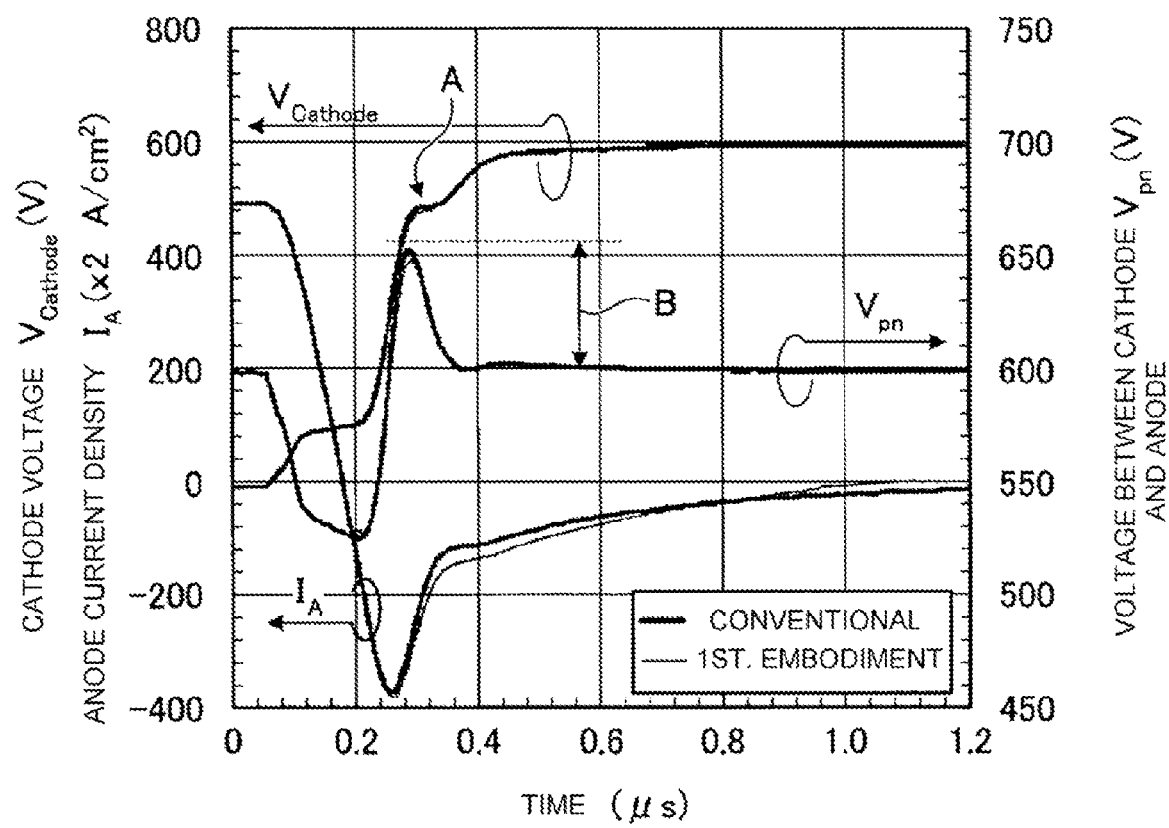
FIG. 27 is a graph showing a set of curves for comparing the turnoff waveforms of a PIN diode according to a first embodiment and a conventional PIN diode.
Figure 28:
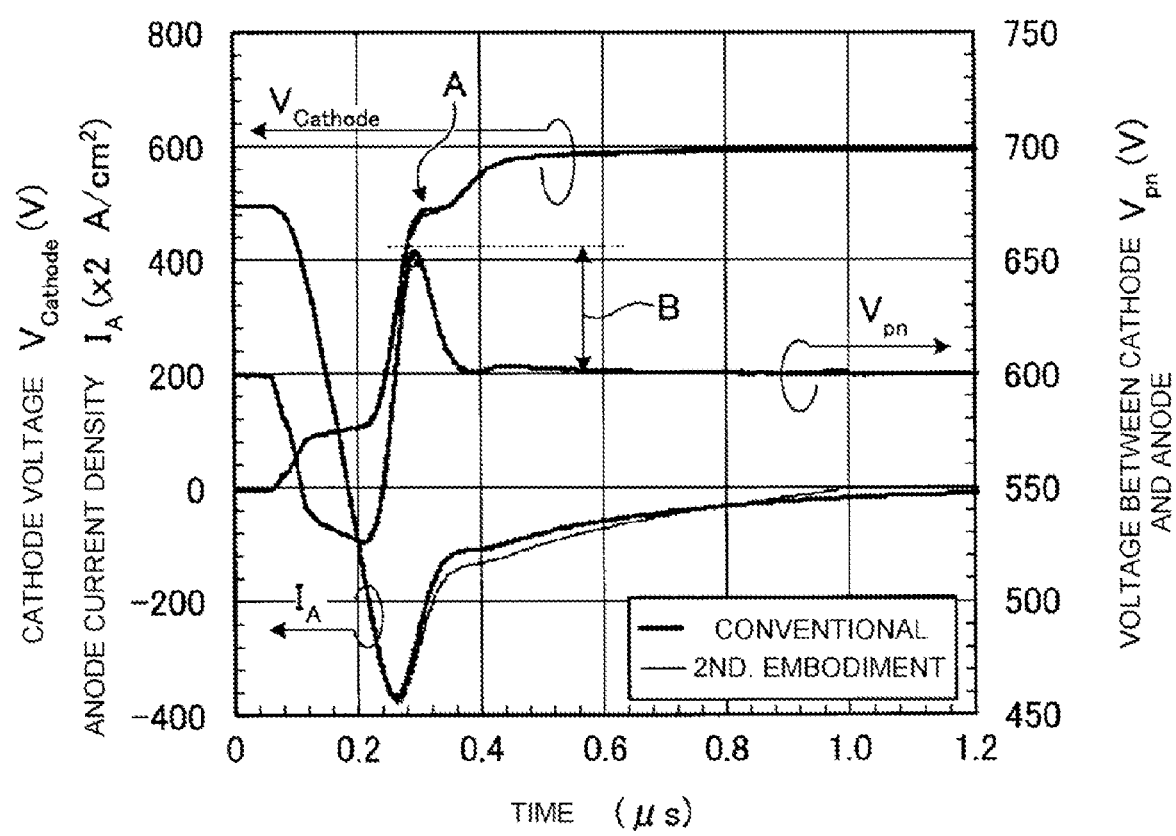
FIG. 28 is a graph showing a set of curves for comparing the turnoff waveforms of a PIN diode according to a second embodiment and the conventional PIN diode.
Figure 29:
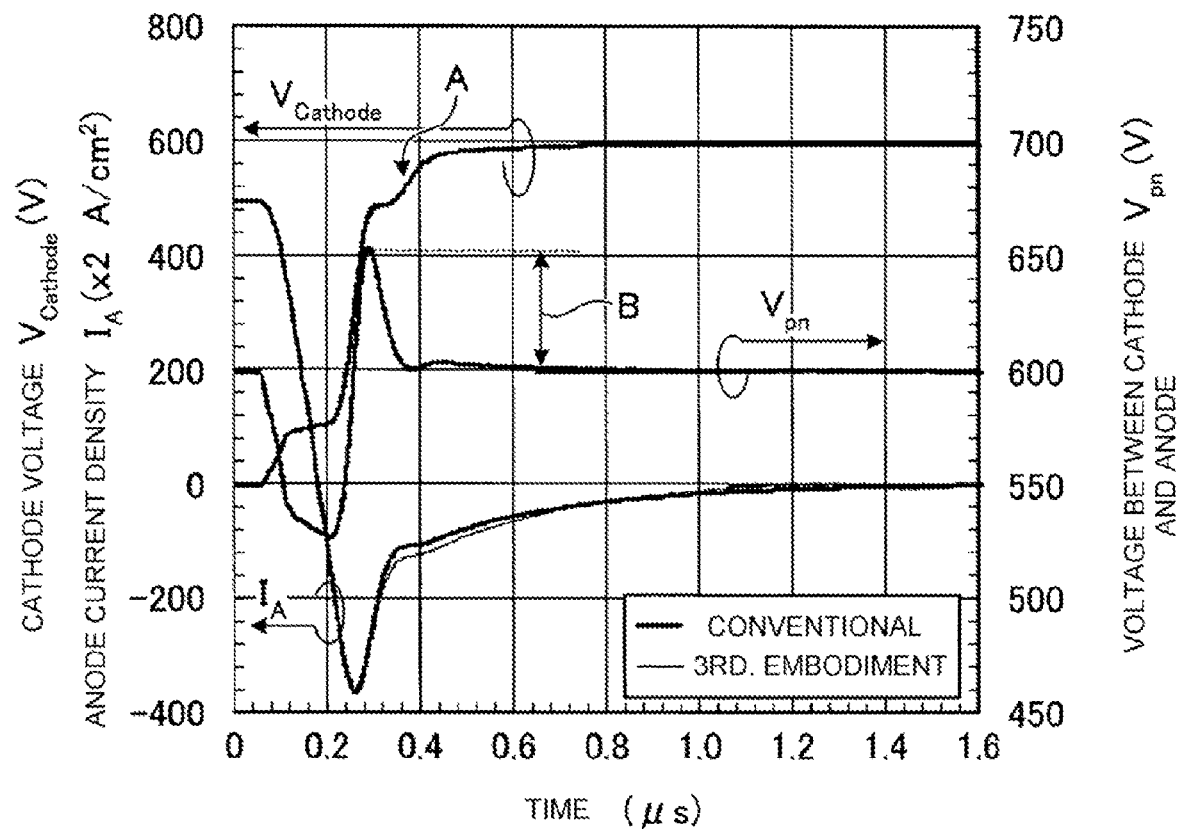
FIG. 29 is a graph showing a set of curves for comparing the turnoff waveforms of a PIN diode according to a third embodiment and the conventional PIN diode.

FIG. 27 is a graph showing a set of curves comparing the turnoff waveforms of the first diode and the conventional diode. FIG. 28 is a graph showing a set of curves comparing the turnoff waveforms of the second diode and the conventional diode. FIG. 29 is a graph showing a set of curves comparing the turnoff waveforms of the third diode and the conventional diode.

As these figures indicate, the reduction rate of the reverse recovery currents of the first through third diodes after the reverse recovery currents reach their peaks is smaller than the reduction rate of the reverse recovery current of the conventional diode after the reverse recovery current reaches its peak. The currents after they decrease, the so-called tail currents, of the first through third diodes reach zero more quickly than the tail current of the conventional diode. The initial reverse recovery voltage A and $\Delta V_{PN}$ max of the first through third diodes caused by the reduction rate of the reverse recovery current and the wiring inductance become small. The first through third diodes exhibit a turnoff loss almost the same as the turnoff loss that the conventional diode exhibits. However, the first through third diodes suppress the cathode voltage rise and quicken the overall turnoff. In other words, the first through third diodes realize high-speed turnoff and soft switching at the same time.

The first and second diodes exhibit almost the same effects. The first and third diodes exhibit almost the same effects.

As the results described above indicate, the XLDN semiconductor layer makes the excess carrier ejection start earlier than in the conventional PIN diode under a low voltage applied in the early stage of a turnoff. The reverse recovery current decreases more slowly than in the conventional PIN diode and, therefore, the oscillation phenomena experienced during the reverse recovery of a diode are prevented from occurring. By preventing the oscillation phenomena from occurring, electromagnetic noises are prevented.

As described herein, the invention is particularly effective for vertical power semiconductor devices such as IGBT's, MOSFET's and PIN diodes and for manufacturing such devices. However, although the invention has been described in connection with the modes for carrying out the invention, various changes, modifications and adaptations will be apparent to persons skilled in the art without departing from the true spirit of the invention. Such changes, modifications and adaptations are intended to be comprehended within the meaning and range of equivalents of the appended claims.

For example, it is not always necessary to shape the lightly doped semiconductor layers and the extremely lightly doped semiconductor layers, which are arranged alternately and repeatedly in the main semiconductor layer, as stripes. Alternatively, the lightly doped semiconductor layers or the extremely lightly doped semiconductor layers may be shaped as islands distributed in the extremely lightly doped semiconductor layer or in the lightly doped semiconductor layer, as the case may be, with no problem. In the main semiconductor layer, the impurity concentration distribution may have three or more peaks and the impurity concentration peaks may be repeated with no problem.

Still alternatively, the buffer layer may be a broad buffer layer with no problem. The broad buffer layer may be, for example, an n⁻-type drift layer in a MOSFET. The average concentration in a direction parallel to the first major surface in the n⁻-type drift layer has a peak (shows a maximum) in the vicinity of the middle portion of the n⁻-type drift layer and reduces gradually toward the cathode and anode of the MOSFET. In the trench-gate IGBT, it is not always necessary for the pitch, at which a pair of the lightly doped semiconductor layer and the extremely lightly doped semiconductor layer is repeated, to be constant. Also in the super-junction MOSFET, it is not always necessary for the pitch, at which a pair of the n-type semiconductor layer and the p-type semiconductor layer is repeated, to be constant.

Moreover, the invention is applicable not only to the PIN diodes but also to merged pin and Schottky (MPS) diodes, bipolar transistors and other devices.

In the descriptions of the modes for carrying out the invention, the dimensions, impurity concentrations and process conditions are exemplary and not restrictive. Although the first conductivity type is an n-type and the second conductivity type is a p-type in the above descriptions, the first conductivity type may be a p-type and the second conductivity type may be an n-type with no problem.

It will be apparent to persons skilled in the art that the manner of practicing the claimed invention has been adequately disclosed in the above description of the preferred modes and embodiments taken together with the drawings.

What is claimed is:

1. A semiconductor device comprising:
   a main semiconductor layer of a first conductivity type, the main semiconductor layer having a first major surface and a second major surface opposite the first major surface, the main semiconductor layer having an impurity concentration distribution that repeatedly increases and decreases in a direction parallel to the first major surface thereof;
   an anode layer of a second conductivity type disposed on the first major surface of the main semiconductor layer;
   an anode electrode disposed on the anode layer;
   a cathode layer of the first conductivity type disposed on the second major surface of the main semiconductor layer;
   a cathode electrode disposed on the cathode layer; and
   a heavily doped layer of the first conductivity type formed between the main semiconductor layer and the cathode layer, the heavily doped layer being doped more heavily than the main semiconductor layer, the heavily doped layer having an impurity concentration distribution that repeatedly increases and decreases in a direction parallel to the first major surface of the main semiconductor layer.

2. The semiconductor device according to claim 1, wherein the impurity concentration distribution in the main semiconductor layer comprises lightly doped semiconductor layers and extremely lightly doped semiconductor layers, the lightly doped semiconductor layers being doped more heavily than the extremely lightly doped semiconductor layers, the lightly doped semiconductor layers and the extremely lightly doped semiconductor layers being shaped in cross-section as stripes extending in a direction perpendicular to the first major surface of the main semiconductor layer and arranged alternately and repeatedly in a direction parallel to the first major surface of the main semiconductor layer.

3. The semiconductor device according to claim 2, wherein a junction plane between each of the extremely lightly doped semiconductor layers and the anode layer is wider than a junction plane between each of the extremely lightly doped semiconductor layers and the cathode layer.

4. A semiconductor device comprising:
   a main semiconductor layer having a first major surface and a second major surface opposite the first major surface, the main semiconductor layer comprising first semiconductor layers of a first conductivity type and second semiconductor layers of a second conductivity type, the first semiconductor layers and the second semiconductor layers being arranged alternately and repeatedly in a direction parallel to the first major surface thereof;

a channel region of the second conductivity type formed in the first major surface of the main semiconductor layer on each of the second semiconductor layers;

a source region of the first conductivity type and a gate region of the second conductivity type formed in each of the channel regions, proximate to the first major surface of the main semiconductor layer;

a gate insulator film formed on each channel region between the source region and the adjacent first semiconductor layers;

a gate electrode disposed on each gate insulator film;

a source electrode in contact with the base region and the source region, with an interlayer insulator film interposed between the source electrode and each gate electrode;

a substrate layer of the first conductivity type disposed on the second major surface of the main semiconductor layer;

a drain layer of the first conductivity type formed on the substrate layer;

a drain electrode disposed on the drain layer; and a heavily doped layer of the first conductivity type formed between the main semiconductor layer and the substrate layer, the heavily doped layer being doped more heavily than the main semiconductor layer, the heavily doped layer having an impurity concentration distribution that repeatedly increases and decreases in a direction parallel to the first major surface of the main semiconductor layer.

5. A semiconductor device comprising:

a main semiconductor layer of a first conductivity type, the main semiconductor layer having a first major surface and a second major surface opposite the first major surface, the main semiconductor layer having an impurity concentration distribution that repeatedly increases and decreases in a direction parallel to the first major surface thereof;

a channel layer of a second conductivity type disposed on the first major surface of the main semiconductor layer;

an emitter region of the first conductivity type formed selectively in the channel layer;

a gate electrode formed in the channel layer in proximity to the emitter region with an insulator film interposed therebetween;

an emitter electrode in contact with the channel layer and the emitter region;

a collector layer of the second conductivity type disposed on the second major surface of the main semiconductor layer;

a collector electrode disposed on the collector layer; and a heavily doped layer of the first conductivity type formed between the main semiconductor layer and the collector layer, the heavily doped layer being doped more heavily than the main semiconductor layer, the heavily doped layer having an impurity concentration distribution that repeatedly increases and decreases in a direction parallel to the first major surface of the main semiconductor layer.

6. The semiconductor device according to claim 5, wherein the impurity concentration distribution in the main semiconductor layer comprises lightly doped semiconductor layers and extremely lightly doped semiconductor layers, the lightly doped semiconductor layers being doped more heavily than the extremely lightly doped semiconductor layers, the lightly doped semiconductor layers and the extremely lightly doped semiconductor layers being shaped in cross-section as stripes extending in a direction perpendicular to the first major surface of the main semiconductor layer and arranged alternately and repeatedly in a direction parallel to the first major surface of the main semiconductor layer.

* * * * *